(12) United States Patent
Koehler et al.

(10) Patent No.: US 10,134,942 B2
(45) Date of Patent: Nov. 20, 2018

(54) DOPING MEDIA FOR THE LOCAL DOPING OF SILICON WAFERS

(71) Applicant: MERCK PATENT GMBH, Darmstadt (DE)

(72) Inventors: Ingo Koehler, Reinheim (DE); Oliver Doll, Dietzenbach (DE); Sebastian Barth, Darmstadt (DE)

(73) Assignee: MERCK PATENT GMBH, Darmstadt (DE)

( * ) Notice: Subject to any disclaimer, the term of this patent is extended or adjusted under 35 U.S.C. 154(b) by 291 days.

(21) Appl. No.: 14/655,857

(22) PCT Filed: Dec. 18, 2013

(86) PCT No.: PCT/EP2013/003838
§ 371 (c)(1),
(2) Date: Jun. 26, 2015

(87) PCT Pub. No.: WO2014/101989
PCT Pub. Date: Jul. 3, 2014

(65) Prior Publication Data
US 2015/0340541 A1    Nov. 26, 2015

(30) Foreign Application Priority Data

Dec. 28, 2012  (EP) .................................... 12008660
Dec. 10, 2013  (EP) .................................... 13005735
(Continued)

(51) Int. Cl.
*H01L 21/00*       (2006.01)
*H01L 31/18*       (2006.01)
(Continued)

(52) U.S. Cl.
CPC .............. *H01L 31/186* (2013.01); *C03C 8/00* (2013.01); *C09D 183/00* (2013.01);
(Continued)

(58) Field of Classification Search
CPC ............. H01L 31/186; H01L 31/02168; H01L 21/2255; H01L 21/2225; C23C 18/14;
(Continued)

(56) References Cited

U.S. PATENT DOCUMENTS 2,486,992 A    11/1949  Sowa
4,277,525 A    7/1981   Nakayama et al.
(Continued)

FOREIGN PATENT DOCUMENTS

DE    10106787 A1    8/2002
GB    1485484 A      9/1977
(Continued)

OTHER PUBLICATIONS

International Search Report dated Feb. 28, 2014 issued in corresponding PCT/EP2013/003838 application (pp. 1-6).

*Primary Examiner* — Richard Booth
(74) *Attorney, Agent, or Firm* — Millen White Zelano and Branigan, PC; John Sopp

(57) ABSTRACT

The present invention relates to a novel process for the preparation of printable, high-viscosity oxide media, and to the use thereof in the production of solar cells.

19 Claims, 8 Drawing Sheets

(30) Foreign Application Priority Data

Dec. 10, 2013 (EP) .................................... 13005736
Dec. 10, 2013 (EP) .................................... 13005737
Dec. 10, 2013 (EP) .................................... 13055734

(51) Int. Cl.

| | |
|---|---|
| *C03C 8/00* | (2006.01) |
| *C30B 31/04* | (2006.01) |
| *C23C 18/12* | (2006.01) |
| *H01L 21/22* | (2006.01) |
| *H01L 21/225* | (2006.01) |
| *H01L 31/0288* | (2006.01) |
| *C30B 29/06* | (2006.01) |
| *C09D 183/04* | (2006.01) |
| *C23C 18/14* | (2006.01) |
| *H01L 31/0216* | (2014.01) |
| *C09D 183/00* | (2006.01) |
| *H01L 21/02* | (2006.01) |
| *H01L 21/48* | (2006.01) |
| *C23C 18/08* | (2006.01) |
| *C23C 18/10* | (2006.01) |

(52) U.S. Cl.
CPC .......... *C09D 183/04* (2013.01); *C23C 18/122* (2013.01); *C23C 18/1216* (2013.01); *C23C 18/1245* (2013.01); *C23C 18/1254* (2013.01); *C23C 18/14* (2013.01); *C30B 29/06* (2013.01); *C30B 31/04* (2013.01); *H01L 21/02129* (2013.01); *H01L 21/2225* (2013.01); *H01L 21/2255* (2013.01); *H01L 21/4867* (2013.01); *H01L 31/0288* (2013.01); *H01L 31/02167* (2013.01); *H01L 31/02168* (2013.01); *H01L 31/1804* (2013.01); *C03C 2205/00* (2013.01); *C23C 18/08* (2013.01); *C23C 18/10* (2013.01); *Y02E 10/547* (2013.01); *Y02P 70/521* (2015.11)

(58) Field of Classification Search
CPC ............ C23C 18/1216; C23C 18/1245; C23C 18/122; C23C 18/10; C23C 18/1254
See application file for complete search history.

(56) References Cited

U.S. PATENT DOCUMENTS

| | | | |
|---|---|---|---|
| 6,695,903 B1 * | 2/2004 | Kubelbeck | C09D 183/02 106/287.14 |
| 8,723,340 B2 | 5/2014 | Stockum et al. | |
| 2005/0022697 A1 | 2/2005 | Benrashid et al. | |
| 2010/0035422 A1 | 2/2010 | Leung | |
| 2010/0081264 A1 | 4/2010 | Leung | |
| 2012/0214270 A1 | 8/2012 | Stockum et al. | |

FOREIGN PATENT DOCUMENTS

| | | |
|---|---|---|
| JP | 50058982 A | 5/1975 |
| JP | 2010219148 A | 9/2010 |
| JP | 2010267787 A | 11/2010 |
| WO | 0054341 A1 | 9/2000 |
| WO | 2011050889 A2 | 5/2011 |

* cited by examiner

DOPING MEDIA FOR THE LOCAL DOPING OF SILICON WAFERS

The present invention relates to a novel process for the preparation of printable, high-viscosity oxide media and to the use thereof in the production of solar cells, and to the products having an improved lifetime produced using these novel media.

The production of simple solar cells or solar cells which are currently represented with the greatest market share in the market comprises the essential production steps outlined below:

1. Saw-Damage Etching and Texture

A silicon wafer (monocrystalline, multicrystalline or quasi-monocrystalline, base doping p or n type) is freed from adherent saw damage by means of etching methods and "simultaneously" textured, generally in the same etching bath. Texturing is in this case taken to mean the creation of a preferentially aligned surface (nature) as a consequence of the etching step or simply the intentional, but not particularly aligned roughening of the wafer surface. As a consequence of the texturing, the surface of the wafer now acts as a diffuse reflector and thus reduces the directed reflection, which is dependent on the wavelength and on the angle of incidence, ultimately resulting in an increase in the absorbed proportion of the light incident on the surface and thus an increase in the conversion efficiency of the same cell.

The above-mentioned etch solutions for the treatment of the silicon wafers typically consist, in the case of monocrystalline wafers, of dilute potassium hydroxide solution to which isopropyl alcohol has been added as solvent. Other alcohols having a higher vapour pressure or a higher boiling point than isopropyl alcohol may also be added instead if this enables the desired etching result to be achieved. The desired etching result obtained is typically a morphology which is characterised by pyramids having a square base which are randomly arranged, or rather etched out of the original surface. The density, the height and thus the base area of the pyramids can be partly influenced by a suitable choice of the above-mentioned components of the etch solution, the etching temperature and the residence time of the wafers in the etching tank. The texturing of the monocrystalline wafers is typically carried out in the temperature range from 70-<90° C., where etching removal rates of up to 10 μm per wafer side can be achieved.

In the case of multicrystalline silicon wafers, the etch solution can consist of potassium hydroxide solution having a moderate concentration (10-15%). However, this etching technique is hardly still used in industrial practice. More frequently, an etch solution consisting of nitric acid, hydrofluoric acid and water is used. This etch solution can be modified by various additives, such as, for example, sulfuric acid, phosphoric acid, acetic acid, N-methyl-pyrrolidone and also surfactants, enabling, inter alia, wetting properties of the etch solution and also its etching rate to be specifically influenced. These acidic etch mixtures produce a morphology of nested etching trenches on the surface. The etching is typically carried out at temperatures in the range between 4° C. to <10° C., and the etching removal rate here is generally 4 μm to 6 μm.

Immediately after the texturing, the silicon wafers are cleaned intensively with water and treated with dilute hydrofluoric acid in order to remove the chemical oxide layer formed as a consequence of the preceding treatment steps and contaminants absorbed and adsorbed therein and also thereon, in preparation for the subsequent high-temperature treatment.

2. Diffusion and Doping

The wafers etched and cleaned in the preceding step (in this case p-type base doping) are treated with vapour consisting of phosphorus oxide at elevated temperatures, typically between 750° C. and <1000° C. During this operation, the wafers are exposed to a controlled atmosphere consisting of dried nitrogen, dried oxygen and phosphoryl chloride in a quartz tube in a tubular furnace. To this end, the wafers are introduced into the quartz tube at temperatures between 600 and 700° C. The gas mixture is transported through the quartz tube. During the transport of the gas mixture through the strongly warmed tube, the phosphoryl chloride decomposes to give a vapour consisting of phosphorus oxide (for example P2O5) and chlorine gas. The phosphorus oxide vapour precipitates, inter alia, on the wafer surfaces (coating). At the same time, the silicon surface is oxidised at these temperatures with formation of a thin oxide layer. The precipitated phosphorus oxide is embedded in this layer, causing mixed oxide of silicon dioxide and phosphorus oxide to form on the wafer surface. This mixed oxide is known as phosphosilicate glass (PSG). This PSG glass has different softening points and different diffusion constants with respect to the phosphorus oxide depending on the concentration of the phosphorus oxide present. The mixed oxide serves as diffusion source for the silicon wafer, where the phosphorus oxide diffuses in the course of the diffusion in the direction of the interface between PSG glass and silicon wafer, where it is reduced to phosphorus by reaction with the silicon on the wafer surface (silicothermally). The phosphorus formed in this way has a solubility in silicon which is orders of magnitude higher than in the glass matrix from which it has been formed and thus preferentially dissolves in the silicon owing to the very high segregation coefficient. After dissolution, the phosphorus diffuses in the silicon along the concentration gradient into the volume of the silicon. In this diffusion process, concentration gradients in the order of 105 form between typical surface concentrations of 1021 atoms/cm$^2$ and the base doping in the region of 1016 atoms/cm$^2$. The typical diffusion depth is 250 to 500 nm and is dependent on the diffusion temperature selected (for example 880° C.) and the total exposure duration (heating & coating phase & injection phase & cooling) of the wafers in the strongly warmed atmosphere. During the coating phase, a PSG layer forms which typically has a layer thickness of 40 to 60 nm. The coating of the wafers with the PSG glass, during which diffusion into the volume of the silicon also already takes place, is followed by the injection phase. This can be decoupled from the coating phase, but is in practice generally coupled directly to the coating in terms of time and is therefore usually also carried out at the same temperature. The composition of the gas mixture here is adapted in such a way that the further supply of phosphoryl chloride is suppressed. During the injection, the surface of the silicon is oxidised further by the oxygen present in the gas mixture, causing a phosphorus oxide-depleted silicon dioxide layer which likewise comprises phosphorus oxide to be generated between the actual doping source, the highly phosphorus oxide-enriched PSG glass, and the silicon wafer. The growth of this layer is very much faster in relation to the mass flow of the dopant from the source (PSG glass), since the oxide growth is accelerated by the high surface doping of the wafer itself (acceleration by one to two orders of magnitude). This enables depletion or separation of the doping source to be achieved in a certain manner, permeation of which with phosphorus oxide diffusing on is influenced by the material flow, which is dependent on the temperature and thus the diffusion coefficient. In this way, the doping of the silicon can be controlled in certain limits. A typical diffusion duration consisting of coating phase and injection phase is, for example, 25 minutes. After this treatment, the tubular furnace is automatically cooled, and the wafers can be removed from the process tube at temperatures between 600° C. to 700° C.

In the case of boron doping of the wafers in the form of an n-type base doping, a different method is carried out, which will not be explained separately here. The doping in these cases is carried out, for example, with boron trichloride or boron tribromide. Depending on the choice of the composition of the gas atmosphere employed for the doping, the formation of a so-called boron skin on the wafers may be observed. This boron skin is dependent on various influencing factors: crucially the doping atmosphere, the temperature, the doping duration, the source concentration and the coupled (or linear-combined) parameters mentioned above.

In such diffusion processes, it goes without saying that the wafers used cannot contain any regions of preferred diffusion and doping (apart from those which are formed by inhomogeneous gas flows and resultant gas pockets of inhomogeneous composition) if the substrates have not previously been subjected to a corresponding pretreatment (for example structuring thereof with diffusion-inhibiting and/or -suppressing layers and materials).

For completeness, it should also be pointed out here that there are also further diffusion and doping technologies which have become established to different extents in the production of crystalline solar cells based on silicon. Thus, mention may be made of
  ion implantation,
  doping promoted via the gas-phase deposition of mixed oxides, such as, for example, those of PSG and BSG (borosilicate glass), by means of APCVD, PECVD, MOCVD and LPCVD processes,
  (co)sputtering of mixed oxides and/or ceramic materials and hard materials (for example boron nitride),
  gas-phase deposition of the last two,
  purely thermal gas-phase deposition starting from solid dopant sources (for example boron oxide and boron nitride) and
  liquid-phase deposition of doping liquids (inks) and pastes.

The latter are frequently used in so-called inline doping, in which the corresponding pastes and inks are applied by means of suitable methods to the wafer side to be doped. After or also even during the application, the solvents present in the compositions employed for the doping are removed by temperature and/or vacuum treatment. This leaves the actual dopant on the wafer surface. Liquid doping sources which can be employed are, for example, dilute solutions of phosphoric or boric acid, and also sol-gel-based systems or also solutions of polymeric borazil compounds. Corresponding doping pastes are characterised virtually exclusively by the use of additional thickening polymers, and comprise dopants in suitable form. The evaporation of the solvents from the above-mentioned doping media is usually followed by treatment at high temperature, during which undesired and interfering additives, but ones which are necessary for the formulation, are either "burnt" and/or pyrolysed. The removal of solvents and the burning-out may, but do not have to, take place simultaneously. The coated substrates subsequently usually pass through a flow-through furnace at temperatures between 800° C. and 1000° C., where the temperatures may be slightly increased compared with gas-phase diffusion in the tubular furnace in order to shorten the passage time. The gas atmosphere prevailing in the flow-through furnace may differ in accordance with the requirements of the doping and may consist of dry nitrogen, dry air, a mixture of dry oxygen and dry nitrogen and/or, depending on the design of the furnace to be passed through, zones of one or other of the above-mentioned gas atmospheres. Further gas mixtures are conceivable, but currently do not have major importance industrially. A characteristic of inline diffusion is that the coating and injection of the dopant can in principle take place decoupled from one another.

3. Removal of the Dopant Source and Optional Edge Insulation

The wafers present after the doping are coated on both sides with more or less glass on both sides of the surface. More or less in this case refers to modifications which can be applied during the doping process: double-sided diffusion vs. quasi-single-sided diffusion promoted by back-to-back arrangement of two wafers in one location of the process boats used. The latter variant enables predominantly single-sided doping, but does not completely suppress diffusion on the back. In both cases, it is currently state of the art to remove the glasses present after the doping from the surfaces by means of etching in dilute hydrofluoric acid. To this end, the wafers are firstly re-loaded in batches into wet-process boats and with their aid dipped into a solution of dilute hydrofluoric acid, typically 2% to 5%, and left therein until either the surface has been completely freed from the glasses, or the process cycle duration, which represents a sum parameter of the requisite etching duration and the process automation by machine, has expired. The complete removal of the glasses can be established, for example, from the complete dewetting of the silicon wafer surface by the dilute aqueous hydrofluoric acid solution. The complete removal of a PSG glass is achieved within 210 seconds at room temperature under these process conditions, for example using 2% hydrofluoric acid solution. The etching of corresponding BSG glasses is slower and requires longer process times and possibly also higher concentrations of the hydrofluoric acid used. After the etching, the wafers are rinsed with water.

On the other hand, the etching of the glasses on the wafer surfaces can also be carried out in a horizontally operating process, in which the wafers are introduced in a constant flow into an etcher in which the wafers pass horizontally through the corresponding process tanks (inline machine). In this case, the wafers are conveyed on rollers either through the process tanks and the etch solutions present therein, or the etch media are transported onto the wafer surfaces by means of roller application. The typical residence time of the wafers during etching of the PSG is about 90 seconds, and the hydrofluoric acid used is somewhat more highly concentrated than in the case of the batch process in order to compensate for the shorter residence time as a consequence of an increased etching rate. The concentration of the hydro-fluoric acid is typically 5%. The tank temperature may optionally additionally be slightly increased compared with room temperature (>25° C.<50° C.).

In the process outlined last, it has become established to carry out the so-called edge insulation sequentially at the same time, giving rise to a slightly modified process flow: edge insulation glass etching. The edge insulation is a process-engineering necessity which arises from the system-inherent characteristic of double-sided diffusion, also in the case of intentional single-sided back-to-back diffusion. A large-area parasitic p-n junction is present on the (later) back of the solar cell, which is, for process-engineering reasons, removed partially, but not completely, during the later processing. As a consequence of this, the front and back of the solar cell are short-circuited via a parasitic and residue p-n junction (tunnel contact), which reduces the conversion efficiency of the later solar cell. For removal of this junction, the wafers are passed on one side over an etch solution consisting of nitric acid and hydrofluoric acid. The etch solution may comprise, for example, sulfuric acid or phosphoric acid as secondary constituents. Alternatively, the etch solution is transported (conveyed) via rollers onto the back of the wafer. The etch removal rate typically achieved in this process is about 1 µm of silicon (including the glass layer present on the surface to be treated) at temperatures between 4° C. to 8° C. In this process, the glass layer still present on the opposite side of the wafer serves as mask, which provides a certain protection against etch encroachment on this side. This glass layer is subsequently removed with the aid of the glass etching already described.

In addition, the edge insulation can also be carried out with the aid of plasma etching processes. This plasma etching is then generally carried out before the glass etching. To this end, a plurality of wafers are stacked one on top of the other, and the outside edges are exposed to the plasma. The plasma is fed with fluorinated gases, for example tetrafluoromethane. The reactive species occurring on plasma decomposition of these gases etch the edges of the wafer. In general, the plasma etching is then followed by the glass etching.

4. Coating of the Front Side with an Antireflection Layer

After the etching of the glass and the optional edge insulation, the front side of the later solar cells is coated with an antireflection coating, which usually consists of amorphous and hydrogen-rich silicon nitride. Alternative antireflection coatings are conceivable. Possible coatings can be titanium dioxide, magnesium fluoride, tin dioxide and/or consist of corresponding stacked layers of silicon dioxide and silicon nitride. However, antireflection coatings having a different composition are also technically possible. The coating of the wafer surface with the above-mentioned silicon nitride essentially fulfills two functions: on the one hand the layer generates an electric field owing to the numerous incorporated positive charges, that can keep charge carriers in the silicon away from the surface and can considerably reduce the recombination rate of these charge carriers at the silicon surface (field-effect passivation), on the other hand this layer generates a reflection-reducing property, depending on its optical parameters, such as, for example, refractive index and layer thickness, which contributes to it being possible for more light to be coupled into the later solar cell. The two effects can increase the conversion efficiency of the solar cell. Typical properties of the layers currently used are: a layer thickness of ~80 nm on use of exclusively the above-mentioned silicon nitride, which has a refractive index of about 2.05. The antireflection reduction is most clearly apparent in the light wavelength region of 600 nm. The directed and undirected reflection here exhibits a value of about 1% to 3% of the originally incident light (perpendicular incidence to the surface perpendicular of the silicon wafer).

The above-mentioned silicon nitride layers are currently generally deposited on the surface by means of the direct PECVD process. To this end, a plasma into which silane and ammonia are introduced is ignited an argon gas atmosphere. The silane and the ammonia are reacted in the plasma via ionic and free-radical reactions to give silicon nitride and at the same time deposited on the wafer surface. The properties of the layers can be adjusted and controlled, for example, via the individual gas flows of the reactants. The deposition of the above-mentioned silicon nitride layers can also be carried out with hydrogen as carrier gas and/or the reactants alone. Typical deposition temperatures are in the range between 300° C. to 400° C. Alternative deposition methods can be, for example, LPCVD and/or sputtering.

5. Production of the Front-Side Electrode Grid

After deposition of the antireflection layer, the front-side electrode is defined on the wafer surface coated with silicon nitride. In industrial practice, it has become established to produce the electrode with the aid of the screen-printing method using metallic sinter pastes. However, this is only one of many different possibilities for the production of the desired metal contacts.

In screen-printing metallisation, a paste which is highly enriched with silver particles (silver content <=80%) is generally used. The sum of the remaining constituents arises from the rheological assistants necessary for formulation of the paste, such as, for example, solvents, binders and thickeners. Further-more, the silver paste comprises a special glass-frit mixture, usually oxides and mixed oxides based on silicon dioxide, borosilicate glass and also lead oxide and/or bismuth oxide. The glass frit essentially fulfills two functions: it serves on the one hand as adhesion promoter between the wafer surface and the mass of the silver particles to be sintered, on the other hand it is responsible for penetration of the silicon nitride top layer in order to facilitate direct ohmic contact with the underlying silicon. The penetration of the silicon nitride takes place via an etching process with subsequent diffusion of silver dissolved in the glass-frit matrix into the silicon surface, whereby the ohmic contact formation is achieved. In practice, the silver paste is deposited on the wafer surface by means of screen printing and subsequently dried at temperatures of about 200° C. to 300° C. for a few minutes. For completeness, it should be mentioned that double-printing processes are also used industrially, which enable a second electrode grid to be printed with accurate registration onto an electrode grid generated during the first printing step. The thickness of the silver metallisation is thus increased, which can have a positive influence on the conductivity in the electrode grid. During this drying, the solvents present in the paste are expelled from the paste. The printed wafer subsequently passes through a flow-through furnace. A furnace of this type generally has a plurality of heating zones which can be activated and temperature-controlled independently of one another. During passivation of the flow-through furnace, the wafers are heated to temperatures up to about 950° C. However, the individual wafer is generally only subjected to this peak temperature for a few seconds. During the remainder of the flow-through phase, the wafer has temperatures of 600° C. to 800° C. At these temperatures, organic accompanying substances present in the silver paste, such as, for example, binders, are burnt out, and the etching of the silicon nitride layer is initiated. During the short time interval of prevailing peak temperatures, the contact formation with the silicon takes place. The wafers are subsequently allowed to cool.

The contact formation process outlined briefly in this way usually carried out simultaneously with the two remaining contact formations (cf. 6 and 7), which is why the term co-firing process is also used in this case.

The front-side electrode grid consists per se of thin fingers (typical number >=68) which have a width of typically 80 µm to 140 µm, and also busbars having widths in the range from 1.2 mm to 2.2 mm (depending on their number, typically two to three). The typical height of the printed silver elements is generally between 10 μm and 25 μm. The aspect ratio is rarely greater than 0.3.

6. Production of the Back Busbars

The back busbars are generally likewise applied and defined by means of screen-printing processes. To this end, a similar silver paste to that used for the front-side metallisation is used. This paste has a similar composition, but comprises an alloy of silver and aluminium in which the proportion of aluminium typically makes up 2%. In addition, this paste comprises a lower glass-frit content. The busbars, generally two units, are printed onto the back of the wafer by means of screen printing with a typical width of 4 mm and compacted and sintered as already described under point 5.

7. Production of the Back Electrode

The back electrode is defined after the printing of the busbars. The electrode material consists of aluminium, which is why an aluminium-containing paste is printed onto the remaining free area of the wafer back by means of screen printing with an edge separation <1 mm for definition of the electrode. The paste is composed of <=80% of aluminium. The remaining components are those which have already been mentioned under point 5 (such as, for example, solvents, binders, etc.). The aluminium paste is bonded to the wafer during the co-firing by the aluminium particles beginning to melt during the warming and silicon from the wafer dissolving in the molten aluminium. The melt mixture functions as dopant source and releases aluminium to the silicon (solubility limit: 0.016 atom percent), where the silicon is $p^+$-doped as a consequence of this injection. During cooling of the wafer, a eutectic mixture of aluminium and silicon, which solidifies at 577° C. and has a composition having a mole fraction of 0.12 of Si, deposits, inter alia, on the wafer surface.

As a consequence of the injection of aluminium into the silicon, a highly doped p-type layer, which functions as a type of mirror ("electric mirror") on parts of the free charge carriers in the silicon, forms on the back of the wafer. These charge carriers cannot overcome this potential wall and are thus kept away from the back wafer surface very efficiently, which is thus evident from an overall reduced recombination rate of charge carriers at this surface. This potential wall is generally referred to as back surface field.

The sequence of the process steps described under points 5, 6 and 7 can, but does not have to, correspond to the sequence outlined here. It is evident to the person skilled in the art that the sequence of the outlined process steps can in principle be carried out in any conceivable combination.

8. Optional Edge Insulation

If the edge insulation of the wafer has not already been carried out as described under point 3, this is typically carried out with the aid of laser-beam methods after the co-firing. To this end, a laser beam is directed at the front of the solar cell, and the front-side p-n junction is parted with the aid of the energy coupled in by this beam. Cut trenches having a depth of up to 15 μm are generated here as a consequence of the action of the laser. Silicon is removed from the treated site here via an ablation mechanism or thrown out of the laser trench. This laser trench typically has a width of 30 μm to 60 μm and is about 200 μm away from the edge of the solar cell.

After production, the solar cells are characterised and classified in individual performance categories in accordance with their individual performances.

The person skilled in the art is aware of solar-cell architectures with both n-type and also p-type base material. These solar cell types include, inter alia, PERC solar cells
PERL solar cells
PERT solar cells
MWT-PERT and MWT-PERL solar cells derived therefrom
bifacial solar cells
back surface contact cells
back surface contact cells with interdigital contacts.

The choice of alternative doping technologies, as an alternative to the gas-phase doping already described at the outset, generally cannot solve the problem of the production of regions with locally different doping on the silicon substrate. Alternative technologies which may be mentioned here are the deposition of doped glasses, or of amorphous mixed oxides, by means of PECVD and APCVD processes. Thermally induced doping of the silicon located under these glasses can easily be achieved from these glasses. However, in order to produce regions with locally different doping, these glasses must be etched by means of mask processes in order to prepare the corresponding structures out of these. Alternatively, structured diffusion barriers can be deposited on the silicon wafers prior to the deposition of the glasses in order thus to define the regions to be doped. However, it is disadvantageous in this process that in each case only one polarity (n or p) of the doping can be achieved. Somewhat simpler than the structuring of the doping sources or of any diffusion barriers is direct laser beam-supported injection of dopants from dopant sources deposited in advance on the wafer surfaces. This process enables expensive structuring steps to be saved. Nevertheless, the disadvantage of possibly desired simultaneous doping of two polarities on the same surface at the same time (co-diffusion) cannot be compensated for, since this process is likewise based on pre-deposition of a dopant source which is only activated subsequently for the release of the dopant. A disadvantage of this (post)doping from such sources is the unavoidable laser damage of the substrate: the laser beam must be converted into heat by absorption of the radiation. Since the conventional dopant sources consist of mixed oxides of silicon and the dopants to be injected, i.e. of boron oxide in the case of boron, the optical properties of these mixed oxides are consequently fairly similar to those of silicon oxide. These glasses (mixed oxides) therefore have a very low coefficient for radiation in the relevant wavelength range. For this absorption reason, the silicon located under the optically transparent glasses is used as absorption source. The silicon is in some cases heated here until it melts, and consequently warms the glass located above it. It facilitates diffusion of the dopants—and does so a multiple faster than would be expected at normal diffusion temperatures, so that a very short diffusion time for the silicon arises (less than 1 second). The silicon is intended to cool again relatively quickly after absorption of the laser radiation as a consequence of the strong transport of the heat away into the remaining, non-irradiated volume of the silicon and at the same time solidify epitactically on the non-molten material. However, the overall process is in reality accompanied by the formation of laser radiation-induced defects, which may be attributable to incomplete epitactic solidification and the formation of crystal defects. This can be attributed, for example, to dislocations and formation of vacancies and flaws as a consequence of the shock-like progress of the process. A further disadvantage of laser beam-supported diffusion is the relative inefficiency if relatively large areas are to be doped quickly, since the laser system scans the surface in a dot-grid process. This disadvantage is unimportant in the case of narrow regions to be doped. However, laser doping requires sequential deposition of the post-treatable glasses.

Object of the Present Invention

The doping technologies usually used in the industrial production of solar cells, namely by gas phase-promoted diffusion with reactive precursors, such as phosphoryl chloride and/or boron tribromide, do not enable local doping and/or locally different doping to be produced specifically on silicon wafers. On use of known doping technologies, the production of such structures is only possible through complex and expensive structuring of the substrates. During the structuring, various masking processes must be matched to one another, which makes the industrial mass production of such substrates very complex. For this reason, concepts for the production of solar cells which require such structuring have not been able to establish themselves to date. It is therefore the object of the present invention to provide an inexpensive process which is simple to carry out, and a medium which can be employed in this process, enabling these problems to be overcome.

Subject-Matter of the Invention

It has been found that these problems can be solved by a process for the preparation of printable, high-viscosity oxide media (viscosity>500 mPas) in the form of doping media. The high-viscosity, doping oxide media are carried out with the aid of an anhydrous sol-gel synthesis by condensation of symmetrically and/or asymmetrically di- to tetrasubstituted alkoxysilanes and/or alkoyalkylsilanes with
  a) symmetrical and asymmetrical carboxylic anhydrides
    i. in the presence of boron-containing compounds and/or
    ii. in the presence of phosphorus-containing compounds or
  b) with strong carboxylic acids
    i. in the presence of boron-containing compounds and/or
    ii. in the presence of phosphorus-containing compounds,
  c) with combination of variants a) and b)
    i. in the presence of boron-containing compounds and/or
    ii. in the presence of phosphorus-containing compounds and converted into paste-form, high-viscosity and printable media by controlled gelling.

In this process, the alkoxysilanes used can preferably contain individual or different saturated or unsaturated, branched or unbranched, aliphatic, ali-cyclic or aromatic radicals, which may in turn be functionalised at any desired position of the alkoxide radical by heteroatoms selected from the group O, N, S, Cl, Br. In particular, the present invention provides a process for the preparation of corresponding oxide media in which the reaction can be carried out in the presence of boron-containing compounds selected from the group boron oxide, boric acid and boric acid esters, and/or of phosphorus-containing compounds selected from the group phosphorus(V) oxide, phosphoric acid, polyphosphoric acid, phosphoric acid esters and phosphonic acid esters containing siloxane-functionalised groups in the alpha- and beta-position. Strong carboxylic acids which can be used are acids from the group formic acid, acetic acid, oxalic acid, trifluoroacetic acid, mono-, di- and tri-chloro-acetic acid, glyoxalic acid, tartaric acid, maleic acid, malonic acid, pyruvic acid, malic acid, 2-oxoglutaric acid. Printable oxide media in the form of doping media based on hybrid sols and/or gels can be prepared by condensation in the presence of suitable organometallic compounds, using alcoholates/esters, hydroxides or oxides of aluminium, gallium, germanium, zinc, tin, titanium, zirconium, arsenic or lead, and mixtures thereof. In a particular embodiment of the preparation process, the oxide medium is gelled to give a high-viscosity, approximately glass-like material, and the resultant product is either redissolved by addition of a suitable solvent selected from the group tetrahydrofuran, dioxane, diethyl ether, ethylene glycol dimethyl ether, N-methylpyrrolidone and dimethylformamide, in pure form or as a mixture, or retransformed into a sol state with the aid of high-shear mixing devices and retransformed by partial or complete structure recovery again (gelling). The stability of the oxide media prepared is improved by addition of "capping agents" selected from the group acetoxytrialkylsilanes, alkoxytrialkylsilanes, halotrialkylsilanes and derivatives thereof. Apart from this preparation process, the present invention also relates, in particular, to the use of the oxide media prepared in accordance with claims 10 to 18 as doping medium in the in the treatment of silicon wafers under various, adapted conditions for the production of various products.

DETAILED DESCRIPTION OF THE INVENTION

It has been found that the problems described above can be solved by a process for the preparation of printable, high-viscosity oxide media (viscosity >500 mPas) if paste-form high-viscosity media (pastes) are prepared in an anhydrous sol-gel-based synthesis by condensation of symmetrically and/or asymmetrically di- to tetrasubstituted alkoxysilanes and/or alkoxyalkylsilanes with
  a) symmetrical and/or asymmetrical carboxylic anhydrides or with
  b) strong carboxylic acids, optionally
  d) with combination of variants a) and b) and by controlled gelling.

In this connection, a paste is taken to mean a composition which, owing to the sol-gel-based synthesis, has a high viscosity of greater than 500 mPas and is no longer flowable.

In accordance with the invention, the oxide media prepared are doping pastes which are prepared by carrying out an anhydrous sol-gel-based synthesis by condensation of symmetrically and asymmetrically di- to tetrasubstituted alkoxysilanes and alkoxyalkylsilanes with
  a) symmetrical and asymmetrical carboxylic anhydrides
    i. in the presence of boron-containing compounds and/or
    ii. in the presence of phosphorus-containing compounds or
  b) with strong carboxylic acids
    iii. in the presence of boron-containing compounds and/or
    iv. in the presence of phosphorus-containing compounds or
  c) with combination of variants a) and b)
    v. in the presence of boron-containing compounds and/or
    vi. in the presence of phosphorus-containing compounds, and the paste-form high-viscosity doping media (doping pastes) according to the invention are prepared by controlled gelling.

In order to carry out the process described, the symmetrically and asymmetrically di- to tetrasubstituted alkoxysilanes and alkoxyalkylsilanes used can contain individual or different saturated or unsaturated branched or unbranched aliphatic, alicyclic or aromatic radicals, which may in turn be functionalised at any desired position of the alkoxide radical by heteroatoms selected from the group O, N, S, Cl, Br.

In order to carry out the process, the boron-containing compounds used are preferably those selected from the group boron oxide, boric acid and boric acid esters.

If phosphorus-containing compounds are used in the process according to the invention, oxide media having good properties are obtained if the phosphorus-containing compounds are selected from the group phosphorus(V) oxide, phosphoric acid, polyphosphoric acid, phosphoric acid esters and phosphonic acid esters containing siloxane-functionalised groups in the alpha- and beta-position.

Strong carboxylic acids which are particularly suitable for use in the process according to the invention are acids from the group formic acid, acetic acid, oxalic acid, trifluoroacetic acid, mono-, di- and trichloroacetic acid, glyoxalic acid, tartaric acid, maleic acid, malonic acid, pyruvic acid, malic acid, 2-oxo-glutaric acid.

The process described enables the printable oxide media to be prepared in the form of doping media based on hybrid sols and/or gels using alcoholates/esters, hydroxides or oxides of aluminium, gallium, germanium, zinc, tin, titanium, zirconium, arsenic or lead, and mixtures thereof ("hybrid" sol or "hybrid" gel). Addition of suitable masking agents, complexing agents and chelating agents in a sub- to fully stoichiometric ratio enables these hybrid sols and gels on the one hand to be sterically stabilised and on the other hand specifically influenced and controlled with respect to their condensation and gelling rate, but also with respect to the rheological properties. Suitable masking agents and complexing agents as well as chelating agents are given in the patent applications WO2012/119686 A, WO2012/119685 A1 and WO2012/119684 A. The contents of these specifications are therefore incorporated into the disclosure content of the present application by way of reference.

In accordance with the invention, the oxide medium is gelled to give a high-viscosity, approximately glass-like material, and the resultant product is either redissolved by addition of a suitable solvent or solvent mixture or retransformed into a sol state with the aid of high-shear mixing devices and allowed to recover to give a homogeneous gel by partial or complete structure recovery again (gelling).

The process according to the invention has proven particularly advantageous, in particular, through the fact that the formulation of the high-viscosity oxide medium takes place without addition of thickeners. In this way, a stable mixture which is stable on storage for a time of at least three months is prepared by the process according to the invention. If "capping agents" selected from the group acetoxytrialkylsilanes, alkoxytrialkylsilanes, halotrialkylsilanes and derivatives thereof are added during the preparation of the oxide media, this results in an improvement in the stability of the media obtained. The oxide media prepared in this way are particularly suitable for use as doping medium in the treatment of silicon wafers for photovoltaic, microelectronic, micromechanical and micro-optical applications.

The oxide media prepared in accordance with the invention can, depending on the consistency, i.e. depending on their rheological properties, such as, for example, their viscosity, be printed by spin or dip coating, drop casting, curtain or slot-dye coating, screen or flexographic printing, gravure, ink-jet or aerosol-jet printing, offset printing, microcontact printing, electrohydro-dynamic dispensing, roller or spray coating, ultrasonic spray coating, pipe jetting, laser transfer printing, pad printing or rotary screen printing. The high-viscosity, doping oxide media are preferably processed by means of screen printing.

Correspondingly prepared oxide media are particularly suitable for the production of PERC, PERL, PERT, IBC solar cells (BJBC or BCBJ) and others, where the solar cells have further architecture features, such as MWT, EWT, selective emitter, selective front surface field, selective back surface field and bifaciality. Furthermore, the oxide media according to the invention can be used for the production of thin, dense glass layers which act as sodium and potassium diffusion barrier in LCD technology as a consequence of thermal treatment, in particular for the production of thin, dense glass layers on the cover glass of a display, consisting of doped $SiO_2$, which prevent the diffusion of ions from the cover glass into the liquid-crystalline phase.

The present invention accordingly also relates to the novel oxide media prepared in accordance with the invention which, prepared by the process described above, comprise binary or ternary systems from the group $SiO_2$—$P_2O_5$, $SiO_2$—$B_2O_3$, $SiO_2$—$P_2O_5$—$B_2O_3$ and $SiO_2$—$Al_2O_3$—$B_2O_3$ and/or mixtures of higher order which arise through the use of alcoholates/esters, acetates, hydroxides or oxides of aluminium, gallium, germanium, zinc, tin, titanium, zirconium or lead during preparation. As already stated above, addition of suitable masking agents, complexing agents and chelating agents in a sub- to fully stoichiometric ratio enables these hybrid sols on the one hand to be sterically stabilised and on the other hand to be specifically influenced and controlled with respect to their condensation and gelling rate, but also with respect to the rheological properties. Suitable masking agents and complexing agents as well as chelating agents are given in the patent applications WO2012/119686 A, WO2012/119685 A1 and WO2012/119684 A.

The oxide media obtained in this way enable a handling- and abrasion-resistant layer to be produced on silicon wafers. This can be carried out in a process in which the oxide medium prepared by a process in accordance with the invention and printed on the surface is dried and compacted for vitrification in a temperature range between 50° C. and 750° C., preferably between 50° C. and 500° C., particularly preferably between 50° C. and 400° C., using one or more heating steps to be carried out sequentially (heating by means of a step function) and/or a heating ramp, forming a handling- and abrasion-resistant layer having a thickness of up to 500 nm.

A heat treatment of the layers vitrified on the surfaces is subsequently carried out at a temperature in the range between 750° C. and 1100° C., preferably between 850° C. and 1100° C., particularly preferably between 850° C. and 1000° C. Consequently, atoms which have a doping action on silicon, such as boron and/or phosphorus, are released to the substrate surface by silico-thermal reduction of their oxides thereon, thereby specifically advantageously influencing the conductivity of the silicon substrate. It is particularly advantageous here that, owing to the heat treatment of the printed substrate, the dopants are transported in depths of up to 1 μm, depending on the treatment duration, and electrical sheet resistivities of less than 10 Ω/sqr are achieved. The surface concentrations of the dopant here can adopt values greater than or equal to $1*10^{19}$ to $1*10^{21}$ atoms/cm$^3$ and is dependent on the nature of the dopant used in the printable oxide medium. It has proven particularly advantageous here that the surface concentration of the parasitic doping of surface regions of the silicon substrate which are not intentionally protected (masked) and are not covered with the printable oxide media consequently subsequently differ by at least two powers of ten from that of regions which have been specifically printed with the printable oxide media. In addition, this result can be achieved by printing the oxide medium as doping medium onto hydrophilic silicon wafer surfaces (provided with wet-chemical and/or native oxide) and/or hydrophobic silicon wafer surfaces (provided with silane termination). The thin oxide layers formed from the oxide media applied to the substrate surfaces thus enable the effective doping dose of the silicon wafer surfaces to be influenced and controlled via the choice of the treatment duration and temperature indirectly via the diffusivity of the dopant, for example of phosphorus, and the segregation coefficient in the thin oxide layer.

In generalised terms, this process for the production of handling- and abrasion-resistant oxidic layers which have a doping action on silicon and silicon wafers can be characterised in that a) oxide media are used as n-type doping media for the printing of silicon wafers, and the printed-on doping media are dried, compacted and subsequently subjected to subsequent gas-phase diffusion with phosphoryl chloride, giving high doping levels in the printed regions and lower doping levels in the regions subjected exclusively to gas-phase diffusion, or b) silicon wafers are printed with the oxide media as p-type oxide medium, in this case with boron-containing precursors, the printed-on doping media are dried, compacted and subsequently subjected to subsequent gas-phase diffusion with boron trichloride or boron tribromide, giving a high doping level in the printed regions and a lower doping level in the regions subjected exclusively to gas-phase diffusion, or c) silicon wafers are printed in a structured manner with the oxide media as n- or p-type doping media, the printed-on doping media are dried, compacted and subsequently subjected to subsequent gas-phase diffusion with, for example, phosphoryl chloride in the case of an n-type doping medium used or with, for example, boron trichloride or boron tribromide in the case of a p-type doping medium used, enabling high doping levels to be obtained in the non-printed regions and lower doping levels to be obtained in the printed regions, to this extent keeping the source concentration of the oxidic doping media used low in a controlled manner as a consequence of the synthesis, and the glasses obtained from the doping media represent a diffusion barrier to the gas-phase diffusants transported from the gas phase to the wafer surface and deposited, or d) silicon wafers are printed with the oxide media as p-type doping media, in this case with boron-containing precursors, the printed-on doping media are dried, compacted and subsequently subjected to subsequent gas-phase diffusion with boron trichloride or boron tribromide, giving high doping levels in the printed regions and lower doping levels in the regions subjected exclusively to gas-phase diffusion, and the boron skin obtained in this case on the wafer surface is subsequently removed from the wafer surface with the aid of, for example, sequential wet-chemical treatment with nitric and hydrofluoric acid, or e) oxide medium deposited over the entire surface of the silicon wafer as doping medium is dried and/or compacted, and the local doping of the underlying substrate material is initiated from the compacted doping oxide medium with the aid of laser irradiation, or f) oxide medium deposited over the entire surface of the silicon wafer as doping medium is dried and compacted, and the doping of the underlying substrate is initiated from the compacted doping oxide medium with the aid of suitable heat treatment, and the local doping of the underlying substrate material is augmented after this doping process with subsequent local laser irradiation, and the dopant is injected deeper into the volume of the substrate, or g) the silicon wafer is printed either over the entire surface or locally with oxide media as doping media, which can be n- and p-doping media, optionally by alternating structures, the printed structures are dried and compacted and encapsulated with suitable diffusion-barrier materials, such as sol-gel-based silicon dioxide layers, sputtered or APCVD- or PECVD-based silicon dioxide, silicon nitride or silicon oxynitride layers, and the doping oxide media are brought to doping of the substrate as a consequence of suitable heat treatment, or h) the silicon wafer is printed either over the entire surface or locally with oxide media as doping media, which can be n- and p-doping media, optionally by alternating structures, the printed structures are dried and compacted and brought to doping of the substrate as a consequence of suitable heat treatment, or i) the silicon wafer is printed either over the entire surface or locally with oxide media as doping media, which can be n- and p-doping media, optionally in an alternating structure sequence, such as, for example, printed n-doping oxide medium of any desired structure width, for example line width, adjacent to non-printed silicon surface, likewise characterised by any desired structure width, the printed structures are dried and compacted, after which the wafer surface can subsequently be provided over the entire surface with a doping medium which induces the opposite majority charge carrier polarity onto the already printed wafer surface, where the last-mentioned doping media can be printable sol-gel-based oxidic doping materials, other printable doping inks and/or pastes, APCVD and/or PECVD glasses provided with dopants, and also dopants from conventional gas-phase diffusion and doping, and the doping media arranged in an overlapping manner and having a doping action are brought to doping of the substrate as a consequence of suitable heat treatment, and in this context the respectively lowest, printed, doping oxide medium must behave as diffusion barrier to the overlying doping medium which induces the contrary majority charge carrier polarity, as a consequence of suitable segregation coefficients and inadequate diffusion lengths; where furthermore the other side of the wafer surface may, but does not necessarily have to, be covered by means of a different and differently deposited (printed, CVD, PVD) diffusion barrier, such as, for example, silicon dioxide or silicon nitride or silicon oxynitride, or j) the silicon wafer is printed either over the entire surface or locally with oxide media as doping media, which can be n- and p-doping media, optionally in an alternating structure sequence, such as, for example, printed n-doping oxide medium of any desired structure width, for example line width, adjacent to non-printed silicon surface, likewise characterised by any desired structure width, the printed structures are dried and compacted, after which the wafer surface can subsequently be provided over the entire surface with a doping medium which induces the opposite majority charge carrier polarity onto the already printed wafer surface, where the last-mentioned doping media can be printable sol-gel-based oxidic doping materials, other printable doping inks and/or pastes, APCVD and/or PECVD glasses provided with dopants, and also dopants from conventional gas-phase diffusion and doping, and the doping media arranged in an overlapping manner and having a doping action are brought to doping of the substrate as a consequence of suitable heat treatment, and in this context the respectively lowest, printed, doping oxide medium must behave as diffusion barrier to the overlying doping medium which induces the contrary majority charge carrier polarity, as a consequence of suitable segregation coefficients and inadequate diffusion lengths; where furthermore the other side of the wafer surface may, but does not necessarily have to, be covered by means of a different and differently deposited dopant source (printable sol-gel-based oxidic doping materials, other printable doping inks and/or pastes, APCVD and/or PECVD glasses provided with dopants, and also dopants from conventional gas-phase diffusion) which can induce the same or also opposite doping to that from the lowest layer on the opposite wafer surface.

In the characterised in this way, simultaneous co-diffusion takes place in a simple manner by temperature treatment of the layers formed from the printed-on oxide media, with formation of n- and p-type layers or such layers exclusively of a single majority charge carrier polarity, which may have different doses of dopant.

For the formation of hydrophobic silicon wafer surfaces, the glass layers formed in this process after the printing of the oxide media according to the invention, drying and compaction thereof and/or doping by temperature treatment are etched with an acid mixture comprising hydrofluoric acid and optionally phosphoric acid, where the etch mixture used may comprise, as etchant, hydrofluoric acid in a concentration of 0.001 to 10% by weight or 0.001 to 10% by weight of hydrofluoric acid and 0.001 to 10% by weight of phosphoric acid in a mixture. The dried and compacted doping glasses can furthermore be removed from the wafer surface using the following etch mixtures: buffered hydrofluoric acid mixtures (BHF), buffered oxide etch mixtures, etch mixtures consisting of hydrofluoric and nitric acid, such as, for example, the so-called p-etches, R-etches, S-etches or etch mixtures, etch mixtures consisting of hydrofluoric and sulfuric acid, where the above-mentioned list makes no claim to completeness.

An alternative doping technology which has already been mentioned at the outset is so-called inline diffusion. This is based on the deposition of the dopant source on the silicon wafers, after which these pass through a belt furnace of corresponding length and temperature and as a consequence of this treatment release the desired dopant to the silicon wafers. Inline diffusion is in principle the highest-performing variant of doping of silicon wafers taking into account industrial mass production of components which are manufactured in billions under considerable cost pressure from two directions. The cost pressure arises both owing to a very pronounced politically and also market-participating competitive situation. Inline diffusion can achieve industrial throughput rates that are usually between 15 to 25% above the usual throughput rates of conventional horizontal tubular-furnace plants—where the inline diffusion-capable furnace systems used are generally less expensive than the typical horizontal tubular-furnace plants. Inline diffusion should thus in principle be able to generate a considerable intrinsic cost advantage over the conventionally used doping technology. Nevertheless, this advantage has hitherto virtually never been implemented efficiently in practice. The reasons for this are multifarious. A main reason for this consists, for example, in the deposition of the dopant source. The dopant sources in inline diffusion are usually applied wet to the wafers by means of suitable coating methods (spraying, roller coating, screen printing, etc.), dried thermally, compacted and introduced into the furnace system for the diffusion. Typical and frequently used dopant sources are, but not exclusively, dilute alcoholic (in ethanol or isopropanol) or also aqueous solutions of phosphoric or boric acid. These solutions should optimally result in a homo-geneous film on the silicon surfaces in order that uniform release of the dopant to the silicon is possible. In general, homogeneous coating is not achieved, for various reasons, in particular on very rough surfaces, such as those of textured silicon wafer surfaces. Phosphoric and boric acid have an increasingly oxidic character after drying of the solution and thermal transformation into polymeric species. The oxides concerned are readily volatile and can therefore very easily contribute to autodoping of regions of the substrate which were originally not homogeneously covered with the dopant source. However, the volatility also makes it more difficult to effect spatial control of the dopant species, whose mobility not only contributes to doping on the treated surface itself (advantageous), but also to doping of wafers and surfaces thereof which have not been provided directly with the source (analogously to conventional gas-phase doping). Owing to the use of the said liquid-phase doping media, process-engineering problems, such as corrosion of the deposition units and of the furnace system, also occur. Corrosion is evident, for example, both in the case of the spray nozzles typically used and also on the wafer conveying systems. Metal ions can thus enter the dopant source, which are then injected into the silicon in the subsequent high-temperature process (cf. below).

Returning to the novel solar-cell architectures already mentioned above, a common feature of all of these is that they are in principle based on structured substrates. However, the structuring also relates to the production of regions with different doping in a sequence which is in principle as desired, but is frequently alternating, in which either regions of one polarity (n or p type) which are doped to a high and low extent or alternatively doped regions of varying polarities (n on p type and vice versa) alternate on one another. For the production of such structures, both structuring of the substrate and also deposition of thin functional layers are conceivable.

The gap between the said structuring requirements and, for example, inline diffusion is bridged inasmuch as suitable doping media can combine these two concepts if they meet at least the following requirements:

dopant sources must be printable in order to facilitate decoupling of pre-deposition and diffusion, so that dopant sources of different polarities can be deposited in small structures on the wafer surface in two successive print steps the printable dopant sources offer the potential to facilitate adequate surface concentrations of dopants for the subsequent ohmic contacting of the doped regions the printable dopant sources must be able to be injected into the treated silicon wafer in a co-diffusion step and thus at the same time have low gas-phase enrichment (evaporation out of the source) in order to achieve the exclusively sharply delimiting and thus local doping the printable dopant sources must have adequate chemical purity in their requisite formulation that is absolutely necessary for the treatment of semiconductor components.

Although the choice of liquid-phase dopant sources enables the structured application of doping sources, the doping action of these media however generally remains, as already described above, not restricted to these structured regions. Considerable entrainment (auto- and proximity-doping) of dopants from the doping source is observed, which nullifies the advantage of the structured deposition. With the solutions known to date, the doping can therefore not be restricted specifically to the deposited regions.

Known doping media additionally have a number of further significant disadvantages which are accompanied by considerable application restrictions. A typical side effect in the use of such doping media is the occurrence of a significant drop in the minority carrier lifetime of the treated silicon wafers. The minority carrier lifetime is an essential base parameter which determines the conversion efficiency of a solar cell: a short lifetime equals low efficiency and vice versa. For the person skilled in the art, everything therefore speaks against the use of the printable doping media known to date. The disadvantageous influence on the carrier lifetime is apparently caused by the raw materials used for the preparation of the doping media. In particular the assistants necessary for paste formulation, and here particularly the polymeric binders, represent a difficult-to-control source of contamination which has an adverse effect on the electronic performance of the silicon. These assistants may contain undesired, harmful metals and metal ions, whose concentration is typically only in the per thousand range. However, silicon reacts very sensitively to metallic contamination in the range from ppb to a few ppm—in particular if the treatment of the silicon is followed by a high-temperature phase which facilitates extremely effective distribution of this harmful contamination in the volume (via diffusion and "doping") of the silicon. Such diffusion in wafers typically occurs as a consequence of high-temperature processes whose purpose is to effect the injection of dopants in order to influence and control the electronic and electrical properties of the silicon crystal—i.e. the reason why the doping media were deposited on the wafer surfaces. Typical and particularly harmful contamination is, for example, iron, copper, titanium, nickel and further transition metals from this group of the Periodic Table of the Elements. These metals at the same time belong to the dopants which diffuse moderately fast to very fast in silicon (the diffusion coefficients are generally five to six orders of magnitude greater than those of the dopants to be intentionally injected), so that they are able to penetrate very much deeper into the volume during the exposure duration of the doping than the desired dopants themselves, and thus impair not only the surface of silicon, but also the entire volume thereof. Thus, in the case of iron, which is by far the most widespread contaminant, and the one generally encountered with the highest concentration, a typical theoretical diffusion depth can be expected which, under typical diffusion conditions, such as, for example, a plateau time of 30 minutes at 900° C., is easily capable of exceeding the usual silicon wafer thickness of 180 µm or less by a multiple. The consequence is a significant reduction in the above-mentioned minority carrier lifetime and, since the solar cell represents a "volume component", that of the efficiency of the solar cell as a whole.

The binders added during the formulation of pastes are generally extremely difficult or even impossible to purify chemically or to free from their freight of metallic trace elements. The effort for their purification is high and, owing to the high costs, is out of proportion to the claim of the creation of an inexpensive and thus competitive, for example screen-printable, source of dopants. These assistants thus represent a constant contamination source by means of which undesired contamination in the form of on metallic species is strongly favoured.

Further disadvantages arise on extended handling duration of the media in the course of application. Extended handling results, for example, in agglutination thereof or rapid partial drying (out) thereof on the screen-printing screen, which may make complex removal of the residues from the printing screen necessary and subject the printing process to time drift. After the printing, the pastes must be dried on the wafer surface and finally subjected to a burning-out process in order to eliminate the formulation assistants in order to achieve the paste properties. The burning-out frequently cannot be achieved completely, making complex removal of the paste residues necessary after the thermal treatment of the wafers. Both phenomena are known. The persistence of, for example, partly burnt-out paste residues on the wafer surface likewise results, besides other problems, in a possible reduction in the effective carrier lifetime. The carrier lifetime is determined by the time-dependent recombination of the minority charge carriers in the volume of the silicon and also as a consequence of recombination at the surface of the wafer. Since contaminants generally limit the carrier lifetime, those which adhere to the wafer surface also result in a reduction thereof by drastically increasing the recombination rate at the wafer surface.

Surprisingly, these problems can be solved by the present invention, more precisely by printable, viscous oxide media according to the invention, which can be prepared by a sol-gel process. In the course of the present invention, these oxide media can be prepared as printable doping media (doping pastes) by means of corresponding additives. A correspondingly adapted process and optimised synthesis approaches enable the preparation of printable doping media
which have excellent storage stability,
which exhibit excellent printing performance with exclusion of agglutination and clumping on the screen,
which have an extremely low intrinsic contamination freight of metallic species and thus do not adversely affect the lifetime of the treated silicon wafers,
which have an adequate doping capacity in order easily to be able to produce even low-ohmic emitters on textured silicon wafers,
which can be adjusted in their content of dopants in such a way that doping profiles and the associated electrical sheet resistivities can be set and controlled very well in a broad range,
which enable very homogeneous doping of the treated silicon wafers,
whose residues can be removed very easily from the surface of treated wafers after the thermal treatment, and
which, owing to the optimised synthesis management, have particularly low so-called autodoping, and for the preparation of which conventionally known thickeners are not necessary, but instead in which the use thereof can be entirely omitted.

The novel high-viscosity doping pastes can be synthesised on the basis of the sol-gel process and can be formulated further if this is necessary.

The synthesis of the sol and/or gel can be controlled specifically by addition of condensation initiators, such as, for example, a carboxylic anhydride and/or a strong carboxylic acid, with exclusion of water. The viscosity can therefore be controlled via the stoichiometry, to be precise, for example, by the addition of the acid anhydride. Addition of a super-stoichiometric amount enables the degree of cross-linking of the silica particles to be adjusted, enabling the formation of a highly swollen and printable network in the form of a paste-form gel, which can be printed onto surfaces, preferably onto silicon wafer surfaces, by means of various printing processes.

When the desired consistency has been reached, the sol-gel reaction can be terminated by addition of small amounts of a protic solvent, for example by addition of branched and unbranched, aliphatic, cyclic, saturated and unsaturated as well as aromatic mono-, di-, tri- and polyols (alcohols), as well as glycols, monoethers, monoacetates and the like thereof, propylene glycols, monoethers and monoacetates thereof, as well as binary, tertiary, quaternary and higher mixtures of such solvents in any desired volume and/or weight mixing ratios, where the said protic solvents may be combined as desired with polar and nonpolar aprotic solvents.

The manner of the sol-gel synthesis using alkoxysilanes and/or alkoxyalkyl-silanes in the presence or further organometallic compound, under in some cases acidic conditions, is generally known to the person skilled in the art from the literature. Examples of the preparation of the invention which can be carried out in more or less modified form and result in pastes according to the invention are appended.

Suitable printing processes for the pastes according to the invention can be the following: spin or dip coating, drop casting, curtain or slot-dye coating, screen or flexographic printing, gravure or ink-jet or aerosol-jet printing, offset printing, microcontact printing, electrohydrodynamic dispensing, roller or spray coating, ultrasonic spray coating, pipe jetting, laser transfer printing, pad printing and rotary screen printing.

This list is not definitive, and other printing processes may also be suitable.

Furthermore, the properties of the doping media according to the invention can be adjusted more specifically by addition of further additives, so that they are ideally suited for specific printing processes and for application to certain surfaces with which they may come into intense interaction. In this way, properties such as, for example, surface tension, viscosity, wetting behaviour, drying behaviour and adhesion capacity can be adjusted specifically. Depending on the requirements of the doping media prepared, further additives may also be added. These may be:

surfactants, tensioactive compounds for influencing the wetting and drying behaviour, antifoams and deaerating agents for influencing the drying behaviour, further high- and low-boiling polar protic and aprotic solvents for influencing the particle-size distribution, the degree of precondensation, the condensation, wetting and drying behaviour as well as the printing behaviour, further high- and low-boiling nonpolar solvents for influencing the particle-size distribution, the degree of precondensation, the condensation, wetting and drying behaviour and the printing behaviour, particulate additives for influencing the rheological properties, particulate additives (for example aluminium hydroxides and aluminium oxides, silicon dioxide) for influencing the dry-film thicknesses resulting after drying as well as the morphology thereof, particulate additives (for example aluminium hydroxides and aluminium oxides, silicon dioxide) for influencing the scratch resistance of the dried films, oxides, hydroxides, basic oxides, alkoxides, precondensed alkoxides of boron, gallium, silicon, germanium, zinc, tin, phosphorus, titanium, zirconium, yttrium, nickel, cobalt, iron, cerium, niobium, arsenic, lead and others for the formulation of hybrid sols, in particular simple and polymeric oxides, hydroxides, alkoxides of boron and phosphorus for the formulation of formulations which have a doping action on semiconductors, in particular on silicon.

In this connection, it goes without saying that each printing and coating method makes its own requirements of the paste to be printed. Typically, parameters which are to be set individually for the particular printing method are those such as the surface tension, the viscosity and the overall vapour pressure of the paste.

Besides their use as doping source, the printable media can be used as scratch-protection and corrosion-protection layers, for example in the production of components in the metal industry, preferably in the electronics industry, and in this case in particular in the manufacture of microelectronic, photovoltaic and microelectromechanical (MEMS) components. Photovoltaic components in this connection are taken to mean, in particular, solar cells and modules. Applications in the electronics industry are furthermore characterised by the use of the said pastes in the following areas, which are mentioned by way of example, but are not listed comprehensively: manufacture of thin-film solar cells from thin-film solar modules, production of organic solar cells, production of printed circuits and organic electronics, production of display elements based on technologies of thin-film transistors (TFTs), liquid crystals (LCDs), organic light-emitting diodes (OLEDs) and touch-sensitive capacitive and resistive sensors.

The present description enables the person skilled in the art to apply the invention comprehensively. Even without further comments, it is therefore assumed that a person skilled in the art will be able to utilise the above description in the broadest scope.

If there is any lack of clarity, it goes without saying that the publications and patent literature cited should be consulted. Accordingly, these documents are regarded as part of the disclosure content of the present description.

For better understanding and in order to illustrate the invention, examples are given below which are within the scope of protection of the present invention. These examples also serve to illustrate possible variants. Owing to the general validity of the inventive principle described, however, the examples are not suitable for reducing the scope of protection of the present application to these alone.

Furthermore, it goes without saying to the person skilled in the art that, both in the examples given and also in the remainder of the description, the component amounts present in the compositions always only add up to 100% by weight, mol-% or % by vol., based on the entire composition, and cannot exceed this, even if higher values could arise from the percent ranges indicated. Unless indicated otherwise, % data are therefore regarded as % by weight, mol-% or % by vol.

The temperatures given in the examples and description as well as in the claims are always in ° C.

EXAMPLES OF LOW-VISCOSITY DOPING MEDIA

Example 1

166 g of ethylene glycol monobutyl ether are initially introduced in a beaker, and 5 g of phosphorus pentoxide (P4O10) are introduced with vigorous stirring. The mixture is stirred until the phosphorus pentoxide has completely dissolved. A slightly yellowish solution forms. 7.15 g of tetraethyl orthosilicate and 12 g of ethylcellulose are added to this solution, and the mixture is stirred until a pasty material forms. The paste is subsequently printed onto silicon wafers using a screen printer. To this end, a screen having the following parameters is used: 230 mesh, 25 µm wire diameter (stainless steel), mounting angle 22.5°, 10+/−2 µm emulsion thickness over fabric. The separation is 1.1 mm, and the doctor-blade pressure is 1 bar. The print layout corresponds to a typical front-surface metallisation with two busbars and a typical number of collecting electrode fingers, for example 68. The nominal opening width of the electrode fingers is 100 µm. The fingers become clogged after only a small number of prints during printing with paste drying in the structures. Less than ten substrates can be printed without flaws.

Example 2

83 g of ethylene glycol monobutyl ether and 83 g of diethylene glycol mono-ethyl ether are initially introduced in a beaker, and 5 g of phosphorus pent-oxide (P4O10) are introduced with vigorous stirring. The mixture is stirred until the phosphorus pentoxide has completely dissolved. A slightly yellowish solution forms. 7.15 g of tetraethyl orthosilicate and 12 g of ethylcellulose are added to this solution, and the mixture is stirred until a pasty material has formed. The paste has a dynamic viscosity of 5 Pa*s, measured at a shear rate of 25 1/s. The paste is subsequently printed onto silicon wafers using a screen printer. A screen having the following parameters is used: 280 mesh, 25 µm wire diameter (stainless steel), mounting angle 22.5°, 8-12 µm emulsion thickness over fabric. The separation is 1.1 mm, and the doctor-blade pressure is 1 bar. The print layout corresponds to a square having an edge length of 4 cm. After the printing, the wafers are dried on a hotplate at 300° C. for 2 minutes and subsequently immediately introduced into a muffle furnace heated to 900° C. The doping action is assessed as a function of the exposure duration in the muffle furnace. After the doping of the wafers, the latter are etched with 5% hydrofluoric acid solution, subsequently treated in an ultrasound-coupled water bath warmed to 50° C. for 5 minutes and finally etched again with 5% hydrofluoric acid. The cleaning action on the wafers is dependent on their exposure duration in the muffle furnace.

FIG. 1 shows a photograph of a wafer printed and dried with a doping paste in accordance with Example 2.

TABLE 1

Cleaning result on use of textured monocrystalline wafers as a function of the doping duration in a muffle furnace, on use of a doping paste in accordance with Example 2.

| Exposure duration [min] | Cleaning result (visual assessment) |
|---|---|
| 10 | Clean after HF - water bath with ultrasound - HF |
| 20 | Clean after HF - water bath with ultrasound - HF |
| 30 | Clean after HF |
| 40 | Clean after HF |

TABLE 2

Doping performance on use of textured monocrystalline wafers as a function of the exposure duration in a muffle furnace, on use of a doping paste in accordance with Example 2.

| Exposure duration [min] | Sheet resistance [Ω/sqr] |
|---|---|
| 10 | 124 |
| 20 | 70 |
| 30 | 107 |
| 40 | 74 |

On use of silicon wafers which have been polished on one side, identical dependences of the cleaning abilities of the wafers used are apparent under the same treatment conditions.

FIG. 2 shows a photomicrograph of a wafer polished on one side, doped for 10 minutes with retention of the parameters described above, using a paste in accordance with Example 2. The photograph shows the wafer surface after cleaning.

FIG. 3 shows a photomicrograph of a wafer polished on one side, doped for 20 minutes using the parameters described above, using a paste in accordance with Example 2. The photograph shows the wafer surface after cleaning.

FIG. 4 shows a photomicrograph of a wafer polished on one side, doped for 30 minutes using the parameters described above, using a paste in accordance with Example 2. The photograph shows the wafer surface and the boundary between printed and non-printed regions after cleaning.

FIG. 5 shows a photomicrograph of a wafer polished on one side, doped for 10 minutes using the parameters described above, using a paste in accordance with Example 2. The photograph shows the wafer surface and the boundary between printed and non-printed regions after cleaning.

After the action of the doping paste in accordance with the conditions out-lined above, the following sheet resistances arise on monocrystalline wafers which have been polished on one side.

TABLE 3

Doping performance on use of monocrystalline wafers which have been polished on one side, as a function of the exposure duration in a muffle furnace, on use of a doping paste in accordance with Example 2.

| Exposure duration [min] | Sheet resistance [Ω/sqr] |
|---|---|
| 10 | 44 |
| 20 | 32 |
| 30 | 27 |
| 40 | 26 |

The doping action of the paste is apparently dependent on the respectively typical surface morphology of the substrates used. In the case of textured monocrystalline wafers, the factor between the actual and apparent area contents of the surface is 1.73; i.e. an identical concentration of dopant in the paste and arising therefrom, provided that the same amount acts for the same material application, which is essentially defined by the same printing process, dopes different amounts of silicon, which gives rise to the dependence of the doping action on the type of wafers used. After burning out, the doping paste has a nominal content by weight of 29.2% of silicon dioxide and 70.2% of phosphorus oxide (if the entire organic material is removed completely and with the assumption that, in spite of the relatively high vapour pressure of P4O10, the latter does not suffer from any weight loss as a consequence of volatility during burning-out).

In all experiments, parasitic co-doping is observed outside the region intentionally printed and thus to be doped.

In the course of 100 printing experiments, the dynamic viscosity of the paste changes from 4.4 Pa*s at the beginning to 5.2 Pa*s, which suggests a continuous loss of solvent.

After a storage duration of a few days, the doping paste has a wobbly and gelatinous consistency which solidifies further to form a relatively solid gel.

Example 3

83 g of ethylene glycol monobutyl ether and 83 g of diethylene glycol mono-ethyl ether are initially introduced in a beaker, and 2.5 g of phosphorus pent-oxide (P4O10) are introduced with vigorous stirring. The mixture is stirred until the phosphorus pentoxide has completely dissolved. A slightly yellowish solution forms. 7.15 g of tetraethyl orthosilicate and 12.3 g of ethylcellulose are added to the solution, and the mixture is stirred until a pasty material forms. The paste has a dynamic viscosity of 5.1 Pa*s, measured at a shear rate of 25 1/s, and a wobbly, gelatinous consistency. After the burning-out, the doping paste has a nominal content by weight (if the entire organic material is removed completely and with the assumption that, in spite of the relatively high vapour pressure of P4O10, the latter does not suffer from any weight loss as a consequence of volatility during burning-out) of 45.2% of silicon dioxide and 54.8% of phosphorus oxide. The paste is subsequently printed onto silicon wafers using a screen printer. A screen having the following parameters is used: 280 mesh, 25 µm wire diameter (stainless steel), mounting angle 22.5°, 8-12 µm emulsion thickness over fabric. The separation is 1.1 mm, and the doctor-blade pressure is 1 bar. The print layout corresponds to a square having an edge length of 4 cm. After the printing, the wafers are dried on a hotplate at 300° C. for 2 minutes and subsequently immediately introduced into a muffle furnace heated to 900° C. The doping action is subsequently assessed as a function of the exposure duration in the muffle furnace. After the doping of the wafers, the latter are etched with 5% hydrofluoric acid solution, subsequently treated in an ultrasound-coupled water bath warmed to 50° C. for 5 minutes and finally etched again with 5% hydrofluoric acid. The cleaning action on the wafers is dependent on their exposure time in the muffle furnace.

TABLE 4

Doping performance on use of monocrystalline wafers which have been polished on one side, as a function of the exposure duration in a muffle furnace, on use of a doping paste in accordance with Example 3.

| Exposure duration [min] | Sheet resistance [Ω/sqr] |
| --- | --- |
| 20 | 800 |
| 40 | 220 |

FIG. 6 shows the doping profile (ECV profile) of a monocrystalline wafer polished on one side after treatment with the doping paste in accordance with Example 12 in a muffle furnace at 900° C. for 40 minutes (blue=phosphorus doping, red=base doping, boron).

In all experiments, parasitic co-doping is observed outside the region intentionally printed and thus to be doped.

Example 4

83 g of ethylene glycol monobutyl ether and 83 g of diethylene glycol mono-ethyl ether are initially introduced in a beaker, and 3.75 g of phosphorus pentoxide ($P_4O_{10}$) are introduced with vigorous stirring. The mixture is stirred until the phosphorus pentoxide has completely dissolved. A slightly yellowish solution forms. 7.15 g of tetraethyl orthosilicate and 12.3 g of ethylcellulose are added to this solution, and the mixture is stirred until a pasty material forms. The paste has a dynamic viscosity of 5.1 Pa*s, measured at a shear rate of 25 1/s, and a wobbly, gelatinous consistency and solidifies to form a gel in a storage time of a few days. After the burning-out, the doping paste has a nominal content by weight (if the entire organic material is removed completely and with the assumption that, in spite of the relatively high vapour pressure of P4O10, the latter does not suffer from any weight loss as a consequence of volatility during burning-out) of 34.5% of silicon dioxide and 64.5% of phosphorus oxide. The paste is subsequently printed onto silicon wafers using a screen printer. A screen having the following parameters is used: 280 mesh, 25 µm wire diameter (stainless steel), mounting angle 22.5°, 8-12 µm emulsion thickness over fabric. The separation is 1.1 mm, and the doctor-blade pressure is 1 bar. The print layout corresponds to a square having an edge length of 4 cm. After the printing, the wafers are dried on a hotplate at 300° C. for 2 minutes and subsequently immediately introduced into a muffle furnace heated to 900° C. The doping action is assessed as a function of the exposure duration in the muffle furnace. After the doping of the wafers, the latter are etched with 5% hydrofluoric acid solution, subsequently post-treated for 5 minutes in an ultrasound-coupled water bath warmed to 50° C. and finally etched again with 5% hydrofluoric acid. The cleaning action on the wafers is dependent on their exposure duration in the muffle furnace.

TABLE 5

Doping performance on use of monocrystalline wafers which have been polished on one side, as a function of the exposure duration in a muffle furnace, on use of a doping paste in accordance with Example 4.

| Exposure duration [min] | Sheet resistance [Ω/sqr] |
| --- | --- |
| 20 | 30 |
| 40 | 35 |

FIG. 7 shows the doping profile (ECV profile) of a monocrystalline wafer polished on one side after treatment with the doping paste in accordance with Example 13 in a muffle furnace at 900° C. for 40 minutes (blue=phosphorus doping, red=base doping, boron).

In all experiments, parasitic co-doping is observed outside the region intentionally printed and thus to be doped.

Example 5

83 g of diethylene glycol monoethyl ether, 41.5 g of ethylene glycol mono-phenyl ether and 41.5 g of terpineol are initially introduced in a beaker, and 3.75 g of phosphorus pentoxide (P4O10) are introduced with vigorous stirring. The mixture is stirred until the phosphorus pentoxide has completely dissolved. A slightly yellowish solution forms. 7.15 g of tetraethyl orthosilicate and 12.3 g of ethylcellulose are added to this solution, and the mixture is stirred until a pasty material has formed. The paste has a dynamic viscosity of 9.7 Pa*s, measured at a shear rate of 25 1/s, and a wobbly, gelatinous consistency and solidifies to form a gel in a storage time of a few days. The paste is subsequently printed onto silicon wafers using a screen printer. A screen having the following parameters is used: 280 mesh, 25 μm wire diameter (stainless steel), mounting angle 22.5°, 8-12 μm emulsion thickness over fabric. The separation is 1.1 mm, and the doctor-blade pressure is 1 bar. The print layout corresponds to a square having an edge length of 4 cm. After the printing, the wafers are dried on a hotplate at 300° C. for 2 minutes and subsequently immediately introduced into a muffle furnace heated to 900° C. The doping action is assessed as a function of the exposure duration in the muffle furnace. After the doping of the wafers, the latter are etched with 5% hydrofluoric acid solution for 2 minutes and subsequently rinsed thoroughly with water.

TABLE 6

Doping performance on use of monocrystalline wafers which have been polished on one side, as a function of the exposure duration in a muffle furnace, on use of a doping paste in accordance with Example 5.

| Exposure duration [min] | Sheet resistance [Ω/sqr] |
| --- | --- |
| 20 | 42 |
| 40 | 36 |

After a storage duration of several weeks, the paste exhibits the formation of finely dispersed white crystals or agglomerates.

In all experiments, parasitic co-doping is observed outside the region intentionally printed and thus to be doped.

Example 6

33 g of ethylene glycol monophenyl ether, 33 g of texanol, 50 g of dibenzyl ether, 50 g of butyl benzoate are initially introduced in a beaker, and 3.75 g of phosphorus pentoxide ($P_4O_{10}$) are introduced with vigorous stirring. The mixture is stirred until the phosphorus pentoxide has completely dissolved. A slightly yellowish solution forms. 7.15 g of tetraethyl orthosilicate and 8 g of ethylcellulose are added to this solution, and the mixture is stirred until a pasty material forms. The paste has a dynamic viscosity of 10 Pa*s, measured at a shear rate of 25 1/s. After a storage duration of a few days, the paste exhibits the formation of finely dispersed white crystals or agglomerates.

Example 7

33 g of ethylene glycol monophenyl ether, 42 g of texanol, 42 g of dibenzyl ether, 50 g of butyl benzoate are initially introduced in a beaker, and 3.75 g of phosphorus pentoxide (P4O10) are introduced with vigorous stirring. The mixture is stirred until the phosphorus pentoxide has completely dissolved. A slightly yellowish solution forms. 7.15 g of tetraethyl orthosilicate and 8 g of ethylcellulose are added to this solution, and the mixture is stirred until a pasty material has formed. The paste has a dynamic viscosity of 9 Pa*s, measured at a shear rate of 25 1/s. After a storage duration of only a few days, the paste exhibits the formation of finely dispersed white crystals or agglomerates.

Example 8

33 g of ethylene glycol monophenyl ether, 42 g of texanol, 42 g of dibenzyl ether, 50 g of butyl benzoate are initially introduced in a beaker, and 5 g of polyphosphoric acid are introduced with vigorous stirring. The mixture is stirred until the phosphorus pentoxide has completely dissolved. A slightly yellowish solution forms. 7.15 g of tetraethyl orthosilicate and 8 g of ethylcellulose are added to this solution, and the mixture is stirred until a pasty material has formed. The paste has a dynamic viscosity of 9 Pa*s, measured at a shear rate of 25 1/s. The paste is subsequently printed onto silicon wafers using a screen printer. A screen having the following parameters is used: 280 mesh, 25 μm wire diameter (stainless steel), mounting angle 22.5°, 8-12 μm emulsion thickness over fabric. The separation is 1.1 mm, and the doctor-blade pressure is 1 bar. The print layout corresponds to a square having an edge length of 4 cm. After the printing, the wafers are dried on a hotplate at 300° C. for 2 minutes and subsequently immediately introduced into a muffle furnace heated to 900° C. for 20 minutes. After the doping of the wafers, the latter are etched with 5% hydrofluoric acid solution for 2 minutes and subsequently rinsed thoroughly with water. The determination of the sheet resistance in the region printed with the paste gives a value of 23 Ω/sqr. The determination of the sheet resistance outside the region printed with the paste with maintenance of a separation of about 4 mm gives a sheet resistance of 54 Ω/sqr.

FIG. 8 shows the doping profile (ECV profile) of a monocrystalline wafer polished on one side after treatment with the doping paste in accordance with Example 8 in a muffle furnace at 900° C. for 20 minutes (blue=phosphorus doping, red=base doping, boron). The profile was measured in the region printed of the paste. A sheet resistance of 23 Ω/sqr is obtained.

FIG. 9 shows the doping profile (ECV profile) of a monocrystalline wafer polished on one side after treatment with the doping paste in accordance with Example 8 in a muffle furnace at 900° C. for 20 minutes (blue=phosphorus doping, red=base doping, boron). The profile was measured at a distance of ~4 mm outside the region printed with the paste. A sheet resistance of 54 Ω/sqr is obtained.

Example 9

6.45 g of crystalline phosphoric acid which has been pre-dried in a desiccator are weighed out into a round-bottomed flask, and 155 g of diethylene glycol monoethyl ether are added. 23 g of tetraethyl orthosilicate, 19 g of DL-lactic acid and 4.8 g of water are added to the solution, and the mixture is warmed at 125° C. with stirring for 30 h. A smooth, colourless, slightly cloudy gel-like material forms. The gel is printed onto textured monocrystalline wafers by means of screen printing. To this end, the following screen and printing parameters are used: 280 mesh, 25 µm wire diameter (stainless steel), mounting angle 22.5°, 8-12 µm emulsion thickness over fabric. The separation is 1.1 mm, and the doctor-blade pressure is 1 bar. The print layout corresponds to a square having an edge length of 2 cm. After the printing, the wafers are dried on a hotplate at 300° C. for 2 minutes and subsequently immediately introduced into a muffle furnace heated to 900° C. for 20 minutes. After the doping of the wafers, the latter are etched with 5% hydrofluoric acid solution for 2 minutes and subsequently rinsed thoroughly with water.

The figure printed onto the wafer has a greyish white colour. The layer formed in the process can easily be removed by vigorous rubbing after drying on the hotplate. In the region printed with the paste, it is not possible to determine a sheet resistance by means of four-point measurement after the doping.

FIG. 10 shows a photograph of the region of a textured monocrystalline silicon wafer printed with the doping paste by means of screen printing. The photograph was taken after heating of the wafer on the hotplate for two minutes. The whitish grey layer is not handling- and abrasion-resistant.

Example 10

6.45 g of crystalline phosphoric acid which has been pre-dried in a desiccator are weighed out into a round-bottomed flask, and 155 g of diethylene glycol monoethyl ether are added. 23 g of tetraethyl orthosilicate and 19 g of lactic acid are added to the solution, and the mixture is warmed at 90° C. with stirring for 70 h. A transparent gel having a smooth consistency forms. The mixture is subsequently treated at 75° C. in a rotary evaporator at 60 mbar for one hour. Determination of the weight difference of the gel before and after the treatment in the rotary evaporator gives a weight loss of 8 g. The gel thus has a nominal content of 3.4% of $SiO_2$ in the paste and a nominal content of 58.7% of $SiO_2$ and 41.3% % of phosphorus oxide in the glass matrix, assuming that the organic constituents of the paste are completely burnt out and no loss of the phosphorus oxide present in the paste occurs during the burning-out. The gel is subsequently homogenised in a mixer under the action of high shear, left to rest for one day and subsequently printed with the aid of a screen printer onto textured monocrystalline wafers which have been polished on one side. To this end, the following screen and printing parameters are used: 280 mesh, 25 µm wire diameter (stainless steel), mounting angle 22.5°, 8-12 µm emulsion thickness over fabric. The separation is 1.1 mm, and the doctor-blade pressure is 1 bar. The print layout corresponds to a square having an edge length of 2 cm. After the printing, the wafers are dried on a hotplate at 300° C. for 2 minutes (handling- and abrasion-resistant) and subsequently immediately introduced into a muffle furnace heated to 900° C. for 20 minutes. After the doping of the wafers, the latter are etched with 5% hydrofluoric acid solution for 2 minutes and subsequently rinsed thoroughly with water. Determination of the sheet resistance (multiple determination) in the region printed with the paste gives values of 26, 38, 41, 41, 37 and 38 Ω/sqr. The sheet resistance outside the printed figure is >1000 Ω/sqr.

FIG. 11 shows a photomicrograph of a region of a textured monocrystalline silicon wafer which has been printed with doping paste by means of screen printing. The photograph was taken after heating of the wafer on the hotplate for two minutes.

FIG. 12 shows a photograph of a region of a textured monocrystalline silicon wafer which has been printed with doping paste by means of screen printing. The photograph was taken after doping of the wafer in the muffle furnace. The bluish colour of the region printed with the doping paste is clearly evident. The coloration is attributable to interference effects and thus clearly shows that the paste was deposited homogeneously on the wafer surface.

The preparation of the paste can also be carried out with a different content of phosphoric acid. Thus, similar doping results are found with paste mixtures which have a content of 8.1 g and 9.7 g of crystalline phosphoric acid. A paste prepared using the last-mentioned amount of phosphoric acid has a dynamic viscosity of 5 Pa*s, measured at a shear rate of 25 1/s.

Furthermore, the following acids can successfully be employed for the preparation of the paste according to the invention: formic acid, acetic acid, oxalic acid, trifluoroacetic acid, mono-, di- and trichloroacetic acid, α-chlorobutyric acid, glycolic acid, glyoxalic acid, oxalic acid, tartaric acid, maleic acid, malonic acid, pyruvic acid, malic acid and 2-oxoglutaric acid, where the syntheses of the pastes can be carried out in a temperature range between 50° C. and 150° C. The respective reaction duration here is dependent on the reaction temperature and is between between 4 h and 400 h. The use of the alternative acids gives comparable and printing and doping results.

The pastes prepared in this way are stable on storage and exhibit absolutely no formation of agglomerations or reductions in their doping actions, which are dependent on the respective storage duration. Furthermore, the pastes prepared in accordance with Example 10 can be modified by the specific addition of monofunctional or monoreactive (capping agents) siloxanes, enabling the storage stability of the doping media to be increased specifically. Monofunctional siloxanes of this type may be: acetoxytrialkylsilanes, alkoxy-trialkylsilanes, halotrialkylsilanes and the like.

FIG. 13 shows a photomicrograph of the region of a monocrystalline silicon wafer polished on one side which has been printed with doping paste by means of screen printing. The photograph was taken after heating of the wafer on the hotplate for two minutes.

FIG. 14 shows a doping profile (ECV measurement) of a silicon wafer polished on one side, printed with the doping paste according to the invention. A sheet resistance of on average 26 Ω/sqr is obtained.

Example 11

6.45 g of crystalline phosphoric acid which has been pre-dried in a desiccator are weighed out into a round-bottomed flask, and 155 g of diethylene glycol monoethyl ether are added. 23 g of tetraethyl orthosilicate and 19 g of oxalic acid are added to the solution, and the mixture is warmed at 140° C. with stirring for 4 h. A transparent gel having a smooth consistency forms. The mixture is subsequently treated at 75° C. in a rotary evaporator at 60 mbar for one hour. The gel is subsequently homogenised in a mixer under the action of high shear and with addition of 2 ml of ethoxytrimethylsilane, left to rest for one day and subsequently printed with the aid of a screen printer onto textured monocrystalline wafers which have been polished on one side. To this end, the following screen and printing parameters are used: 280 mesh, 25 µm wire diameter (stainless steel), mounting angle 22.5°, 8-12 µm emulsion thickness over fabric. The separation is 1.1 mm, and the doctor-blade pressure is 1 bar. The print layout corresponds to a square having an edge length of 2 cm. After the printing, the wafers are dried on a hotplate at 300° C. for 2 minutes (handling- and abrasion-resistant) and subsequently immediately introduced into a muffle furnace heated to 900° C. for 20 minutes. After the doping of the wafers, the latter are etched with 5% hydrofluoric acid solution for 2 minutes and subsequently rinsed thoroughly with water. Determination of the sheet resistance (multiple determination) in the region printed with the paste gives values of on average 32 Ω/sqr. The sheet resistance outside the printed figure is >1000 Ω/sqr.

Example 12

6.45 g of crystalline phosphoric acid which has been pre-dried in a desiccator are weighed out into a round-bottomed flask, and 120 g of diethylene glycol monoethyl ether and 40 g of tetramethylolpropane are added. 23 g of tetra-ethyl orthosilicate and 19 g of formic acid are added to the solution, and the mixture is brought to reflux with stirring for 2 h. A transparent gel having a tacky consistency forms. The mixture is subsequently treated at 75° C. in a rotary evaporator at 60 mbar for one hour, during which a weight loss of 8 g occurs. The gel is subsequently homogenised in a mixer under the action of high shear and with addition of 2 ml of ethoxytrimethylsilane, left to rest for one day and subsequently printed with the aid of a screen printer onto textured monocrystalline wafers which have been polished on one side. To this end, the following screen and printing parameters are used: mesh count 165 cm$^{-1}$, 27 μm thread diameter (polyester), mounting angle 22.5°, 8-12 μm emulsion thickness over fabric. The separation is 1.1 mm, and the doctor-blade pressure is 1 bar. The print layout corresponds to a square having an edge length of 2 cm. After the printing, the wafers are dried on a hotplate at 300° C. for 2 minutes (handling- and abrasion-resistant) and subsequently immediately introduced into a muffle furnace heated to 900° C. for 20 minutes. After the doping of the wafers, the latter are etched with 5% hydrofluoric acid solution for 2 minutes and subsequently rinsed thoroughly with water. Determination of the sheet resistance (multiple determination) in the region printed with the paste gives values of on average 35 Ω/sqr. The sheet resistance outside the printed figure is >1000 Ω/sqr.

Example 13

6.45 g of crystalline phosphoric acid which has been pre-dried in a desiccator are weighed out into a round-bottomed flask, and 61 g of diethylene glycol monoethyl ether, 77 g of tetraethylene glycol and 13 g of dibenzyl ether are added. 23 g of tetraethyl orthosilicate and 19 g of formic acid are added to this solution, and the mixture is brought to reflux with stirring for 30 minutes. A transparent gel having a smooth consistency forms. The mixture is subsequently treated at 75° C. in a rotary evaporator at 60 mbar for one hour. The gel is subsequently homogenised in a mixer under the action of high shear and with addition of 2 ml of ethoxytrimethylsilane.

Example 14

6.45 g of crystalline phosphoric acid which has been pre-dried in a desiccator are weighed out into a round-bottomed flask, and 80 g of diethylene glycol monoethyl ether and 80 g of 1,3-butanediol are added. 23 g of tetraethyl orthosilicate and 19 g of formic acid are added to the solution, and the mixture is brought to reflux with stirring for 30 minutes. A transparent gel having a smooth consistency forms. The mixture is subsequently treated at 75° C. in a rotary evaporator at 60 mbar for one hour. The gel is subsequently homogenised in a mixer under the action of high shear and with addition of 2 ml of ethoxytrimethylsilane.

Example 15

6.45 g of crystalline phosphoric acid which has been pre-dried in a desiccator are weighed out into a round-bottomed flask, and 38 g of 1,2-propanediol, 1,4-butanediol, 61 g of ethylene glycol and 15 g of dibenzyl ether are added. 23 g of tetraethyl orthosilicate and 23 g of glyoxalic acid are added to the solution, and the mixture is brought to reflux with stirring for 8 hours. A transparent gel having a smooth consistency forms. The mixture is subsequently treated at 75° C. in a rotary evaporator at 60 mbar for one hour. The gel is subsequently homogenised in a mixer under the action of high shear and with addition of 2 ml of ethoxytrimethylsilane.

Example 16

6.45 g of crystalline phosphoric acid which has been pre-dried in a desiccator are weighed out into a round-bottomed flask, and 80 g of diethylene glycol monoethyl ether and 80 g of 2-((2-butoxy)ethoxy)ethylene glycol acetate are added. 23 g of tetraethyl orthosilicate and 19 g of glycolic acid are added to this solution, and the mixture is brought to reflux with stirring for 45 minutes. A transparent gel having a smooth consistency forms. The mixture is subsequently treated at 75° C. in a rotary evaporator at 60 mbar for one hour. The gel is subsequently homogenised in a mixer under the action of high shear and with addition of 2 ml of ethoxytrimethylsilane.

Example 17

6.45 g of crystalline phosphoric acid which has been pre-dried in a desiccator are weighed out into a round-bottomed flask, and 80 g of diethylene glycol monoethyl ether and 80 g of glycerol are added. 23 g of tetraethyl orthosilicate and 21 g of malonic acid are added to the solution, and the mixture is brought to reflux with stirring for 180 minutes. A transparent gel having a slightly tacky consistency forms. The mixture is subsequently treated at 75° C. in a rotary evaporator at 60 mbar for one hour. The gel is subsequently homogenised in a mixer under the action of high shear and with addition of 2 ml of ethoxytrimethylsilane, left to rest for one day and subsequently printed with the aid of a screen printer onto textured monocrystalline wafers which have been polished on one side. To this end, the following screen and printing parameters are used: mesh count 165 cm$^{-1}$, 27 μm thread diameter (polyester), mounting angle 22.5°, 8-12 μm emulsion thickness over fabric. The separation is 1.1 mm, and the doctor-blade pressure is 1 bar. The print layout corresponds to a square having an edge length of 2 cm. After the printing, the wafers are dried on a hotplate at 300° C. for 2 minutes (handling- and and abrasion-resistant) and subsequently immediately introduced into a muffle furnace heated to 900° C. for 20 minutes. After the doping of the wafers, the latter are etched with 5% hydrofluoric acid solution for 2 minutes and subsequently rinsed thoroughly with water. Determination of the sheet resistance (multiple determination) in the region printed with the paste gives values of on average 43 Ω/sqr. The sheet resistance outside the printed figure is >1000 Ω/sqr.

Example 18

59.6 g of crystalline phosphoric acid which has been pre-dried in a desiccator are weighed out into a round-bottomed flask, and 110 g of tetrahydrofuran are added (reaction mixture 1). The phosphoric acid is dissolved with stirring and refluxing of the reaction mixture, and 89 g of acetic anhydride are added. A mixture consisting of 103 g of tetrahydrofuran and 103 g of tetraethyl orthosilicate is subsequently added to the reaction mixture in a sufficiently rapid drop sequence so that the addition is complete within 5 minutes. The reaction mixture is subsequently refluxed for a further 60 minutes and then allowed to cool. 123 g of diethylene glycol monoethyl ether and 10 g of glyoxalic acid are weighed out into a stirred apparatus with attached water separator and dropping funnel, and the mixture is subsequently heated to 125° C. with the aid of an oil bath. 79 g of the reaction mixture consisting of tetrahydrofuran, acetic anhydride and the condensate of phosphoric acid and tetraethyl orthosilicate (reaction mixture 1) are introduced into the dropping funnel. When the above-mentioned desired reaction temperature has been reached, the mixture located in the dropping funnel is rapidly added dropwise to the stirred apparatus with vigorous stirring. After the dropwise addition, the reaction mixture begins to boil, and condensate collects in the water separator. In order to increase the distillation yield, the temperature of the oil bath is increased to 150° C. after addition of the second reaction mixture. The time from beginning of distillation to gelling of the reaction batch is monitored. The gelling of the mixture occurs after 45 minutes. After the gel formation, the heat source is removed, and the gel is thus allowed to cool in the apparatus. A distillate weight of 97 g collects in the water separator. The cooled paste is subsequently evacuated to 30 mbar in a rotary evaporator at 60° C., during which a further weight loss of 5 g occurs. The paste is then allowed to cool. The paste can, but does not necessarily have to, be homogenised in a mixer under the action of high shear and with addition of 2 ml of ethoxytrimethylsilane. The addition of ethoxytrimethylsilane can also take place during re-warming at 60° C. for 1 h. The paste is smooth and creamy and can be processed very easily by means of screen printing. To this end, a printing screen having a mesh count of 165 cm$^{-1}$, a thread diameter of 27 μm (polyester), a mounting angle of 22.5° and an emulsion thickness of 8-12 μm over fabric is used. The separation is 1.1 mm, and the doctor-blade pressure is 1 bar. The print layout corresponds to a square having an edge length of 2 cm. The wet-film weight output during printing can be varied between 0.6 mg/cm$^2$ to 1.5 mg/cm$^2$ as a consequence of the specific influencing of the printing parameters. After the printing, the wafers are dried on a hotplate at 300° C. for 2 minutes (handling- and abrasion-resistant) and subsequently immediately introduced into a muffle furnace heated to 950° C. for 15 minutes. After the doping of the wafers, the latter are etched with 5% hydrofluoric acid solution for 2 minutes and subsequently rinsed thoroughly with water. Determination of the sheet resistance (multiple determination) in the region printed with the paste gives values of on average 33 Ω/sqr. The sheet resistance outside the printed figure was >1000 Ω/sqr.

Example 19

123 g of diethylene glycol monoethyl ether and 11 g of malonic acid are weighed out into a stirred apparatus with attached water separator and dropping funnel. The mixture is subsequently heated to 125° C. with the aid of an oil bath. 79 g of reaction mixture 1 in accordance with Example 18 are introduced into the dropping funnel. When the above-mentioned desired reaction temperature has been reached, the mixture located in the dropping funnel is rapidly added dropwise to the stirred apparatus with vigorous stirring. After the dropwise addition, the reaction mixture begins to boil, and condensate collects in the water separator. In order to increase the distillation yield, the temperature of the oil bath is increased to 150° C. after addition of the second reaction mixture. The time from beginning of distillation to gelling of the reaction batch is monitored. The gelling of the mixture occurs after about 57 minutes. After the gel formation, the heat source is removed, and the gel is allowed to cool in the apparatus. A distillate weight of about 89 g collects in the water separator. The cooled paste is subsequently evacuated to 30 mbar in a rotary evaporator at 60° C., during which a further weight loss of 3 g occurs. The paste is then cooled. The paste obtained can, but does not necessarily have to, be homogenised in a mixer under the action of high shear and with addition of 2 ml of ethoxytrimethylsilane. The addition of ethoxytrimethylsilane can also take place during re-warming at 60° C. for 1 h. The paste is smooth and creamy and can be processed very readily by means of screen printing. To this end, a printing screen having a mesh count of 165 cm$^{-1}$, a thread diameter of 27 μm (polyester), a mounting angle of 22.5° and an emulsion thickness of 8-12 μm over fabric is used. The separation is 1.1 mm, and the doctor-blade pressure is 1 bar. The print layout corresponds to a square having an edge length of 2 cm. The wet-film weight output during printing can be varied between 0.6 mg/cm$^2$ to 1.5 mg/cm$^2$ as a consequence of the specific influencing of the printing parameters. After the printing, the wafers are dried on a hotplate at 300° C. for 2 minutes (handling- and abrasion-resistant) and subsequently immediately introduced into a muffle furnace heated to 950° C. for 15 minutes. After the doping of the wafers, the latter are etched with 5% hydrofluoric acid solution for 2 minutes and subsequently rinsed thoroughly with water. Determination of the sheet resistance (multiple determination) in the region printed with the paste gives values of on average 37 Ω/sqr. The sheet resistance outside the printed figure is >1000 Ω/sqr.

The content of acetic anhydride in reaction mixture 1 in accordance with Example 18 can be varied. For this purpose, it has proven advantageous to use weights between 50 g and 204 g of the reactant. If the amount of acetic anhydride initially introduced in the reaction mixture exceeds 100 g, the tetraethyl orthosilicate can also be added dropwise to the warm reaction mixture without addition of tetrahydrofuran. Furthermore, the duration of refluxing after complete addition of all reactants can be between 30 minutes and 240 minutes. Suitable inert solvents, apart from tetrahydrofuran, are further sufficiently polar and aprotic solubilisers, such as, for example, 1,4-dioxane and dibenzyl ether, where other comparable solvents can also be employed for this purpose. The synthesis of the doping paste can optionally also be carried out in modified form, for which purpose a corresponding amount of tetraethyl orthosilicate pre-heated to 50° C. to 140° C. with the aid of an oil bath can be employed in a stirred apparatus. A mixture of the corresponding amount of phosphoric acid dissolved in tetrahydrofuran and acetic anhydride is then slowly and carefully added dropwise to the warmed and vigorously stirred tetraethyl orthosilicate. The reaction commences immediately during the dropwise addition and is highly exothermic. The temperature of the pre-warmed tetraethyl orthosilicate plays a crucial role in determining the dropwise addition rate to be used, where: the warmer, the slower the drop sequence. Spontaneously occurring precipitate formation, which must be avoided, must be noted in particular here at the drop entry point. During the performance of the reaction and depending on the temperature selected, low-boiling components, which can advantageously be removed from the reaction mixture with the aid of a water separator, are expelled. The progress of the reaction can be monitored from the increase in the viscosity. As soon as the reaction mixture remaining begins to take on a syrup-like character, it is quickly covered by means of the second reaction mixture consisting of a solution of the solvents and solvent mixtures indicated in the above-mentioned examples and also the carboxylic acids mentioned in the same examples, with the aid of a dropping funnel, with the syrup-like reaction material dissolving smoothly in the inflowing reaction mixture. The formation of a glass-like material from the syrup-like reaction mixture should be avoided under all circumstances. After the covering, the reaction is continued until gelling commences. The gelling in all cases proceeds more quickly the higher the selected reaction temperature and the greater the amount of carboxylic acid employed. The end-capping of the doping paste can also be carried out with greater amounts than the 2 ml described (usually 2 ml to 5 ml per batch size described above). It goes without saying that all the paste syntheses described can also be carried out with boron-containing precursors which substitute for the phosphorus precursor.

Figure 1:
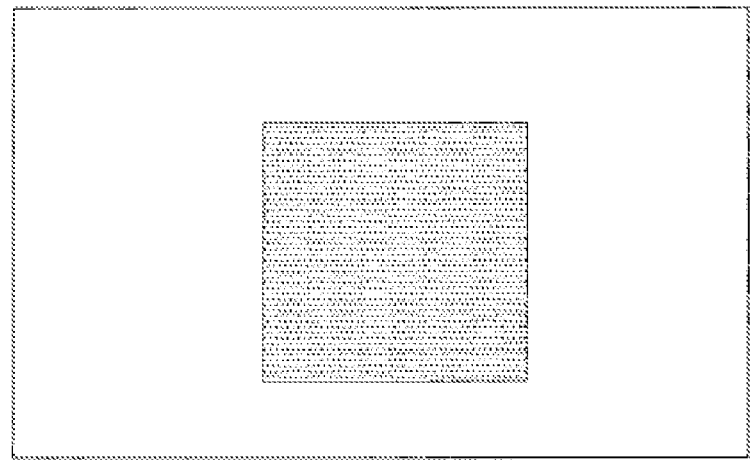
FIG. 1: Photograph of a wafer printed and dried with a doping paste in accordance with Example 2.
Figure 2:
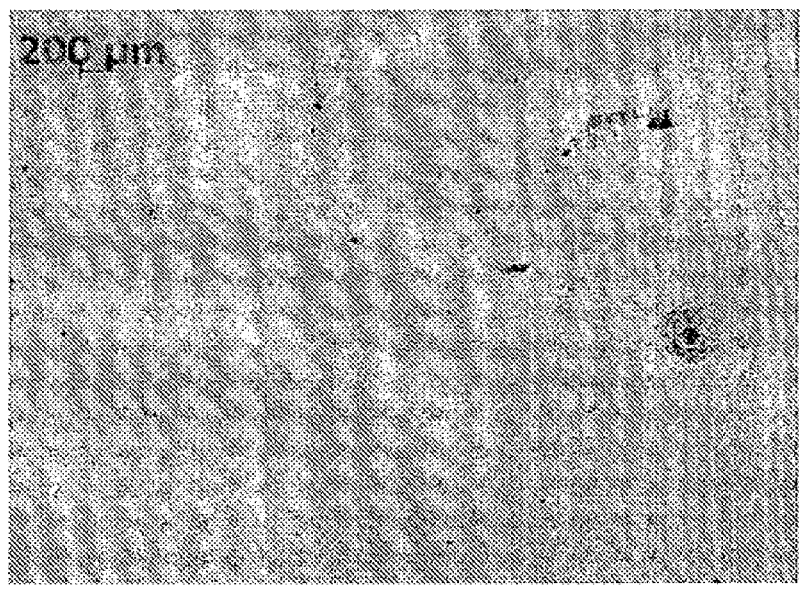
FIG. 2: Photomicrograph of a wafer polished on one side, doped with a paste in accordance with Example 2 for 10 minutes. The photograph shows the wafer surface after cleaning.
Figure 3:
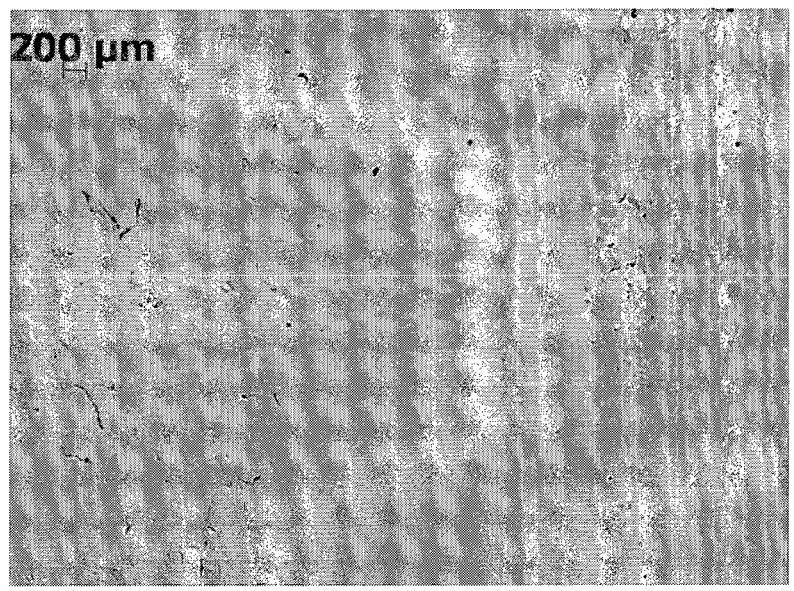
FIG. 3: Photomicrograph of a wafer polished on one side, doped with a paste in accordance with Example 2 for 20 minutes. The photograph shows the wafer surface after cleaning.
Figure 4:
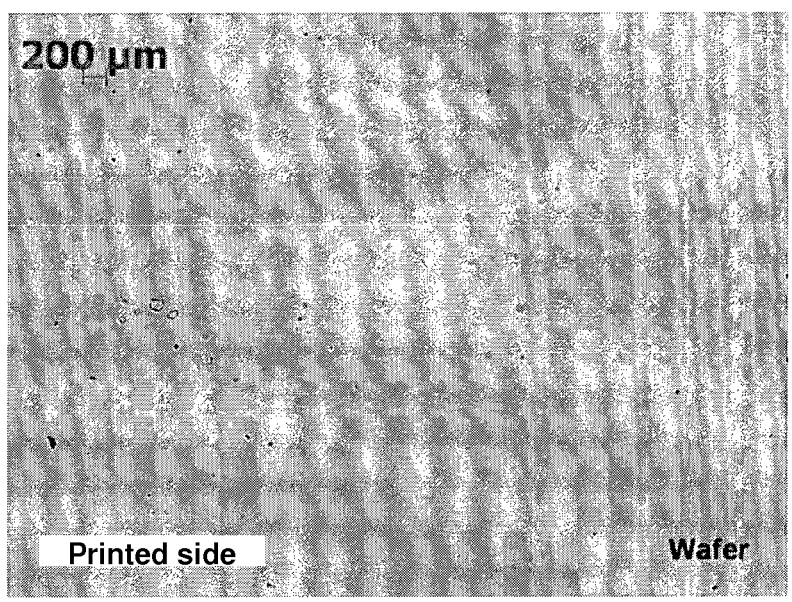
FIG. 4: Photomicrograph of a wafer polished on one side, doped with a paste in accordance with Example 2 for 30 minutes. The photograph shows the wafer surface and the boundary between printed and non-printed regions after cleaning.
Figure 5:
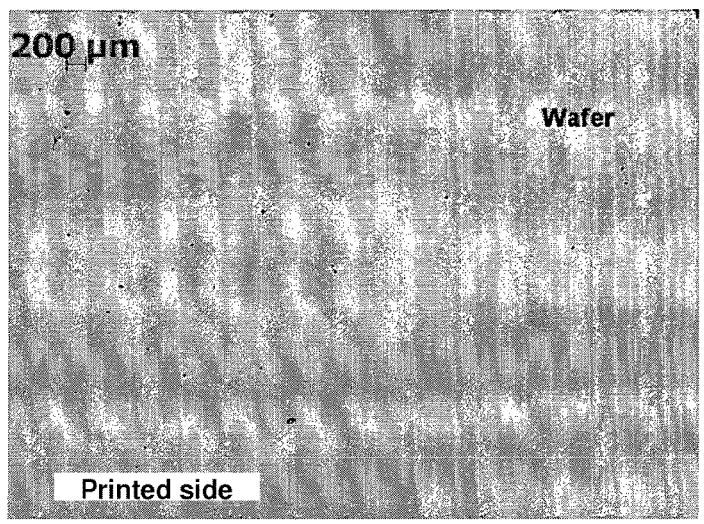
FIG. 5: Photomicrograph of a wafer polished on one side, doped with a paste in accordance with Example 2 for 10 minutes. The photograph shows the wafer surface and the boundary between printed and non-printed regions after cleaning.
Figure 6:
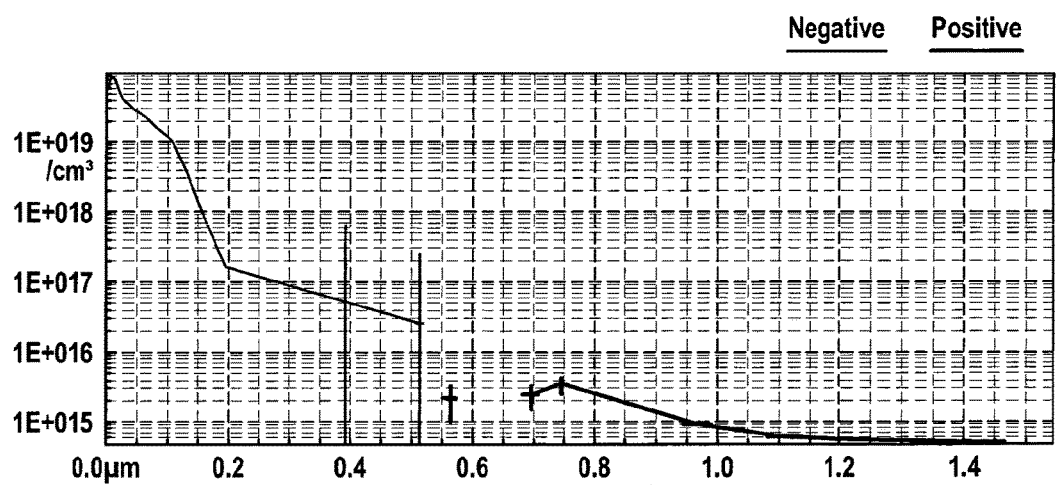
FIG. 6: Doping profile (ECV profile) of a monocrystalline wafer polished on one side after treatment with a doping paste in accordance with Example 3 in a muffle furnace at 900° C. for 40 minutes (blue=phosphorus doping, red=base doping, boron).
Figure 7:
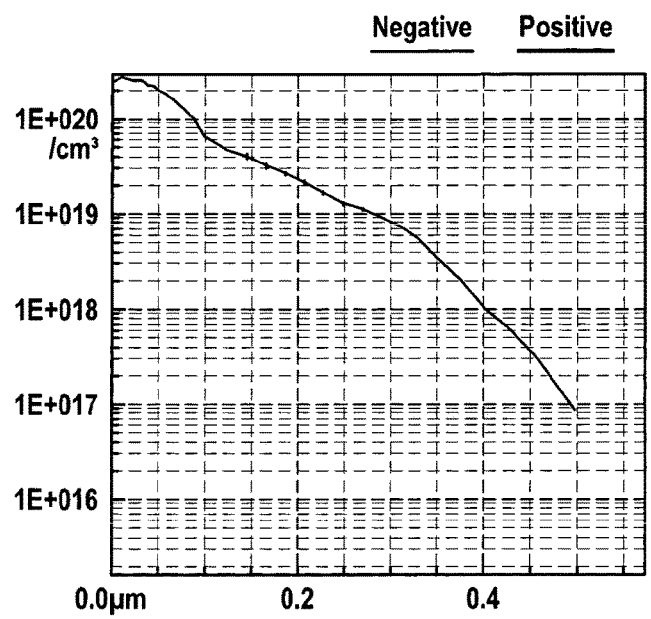
FIG. 7: Doping profile (ECV profile) of a monocrystalline wafer polished on one side after treatment with a doping paste in accordance with Example 3 in a muffle furnace at 900° C. for 40 minutes (blue=phosphorus doping, red=base doping, boron).
Figure 8:
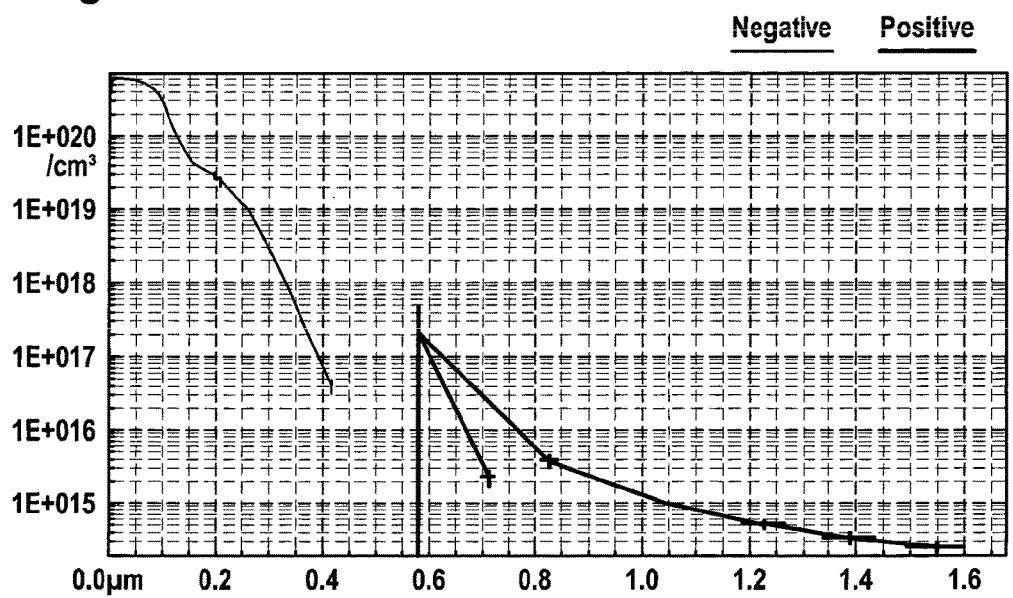
FIG. 8: Doping profile (ECV profile) of a monocrystalline wafer polished on one side after treatment with the doping paste in accordance with Example 8 in a muffle furnace at 900° C. for 20 minutes (blue=phosphorus doping, red=base doping, boron). The profile was measured in the region printed of the paste; sheet resistance: 23 Ω/sqr.
Figure 9:
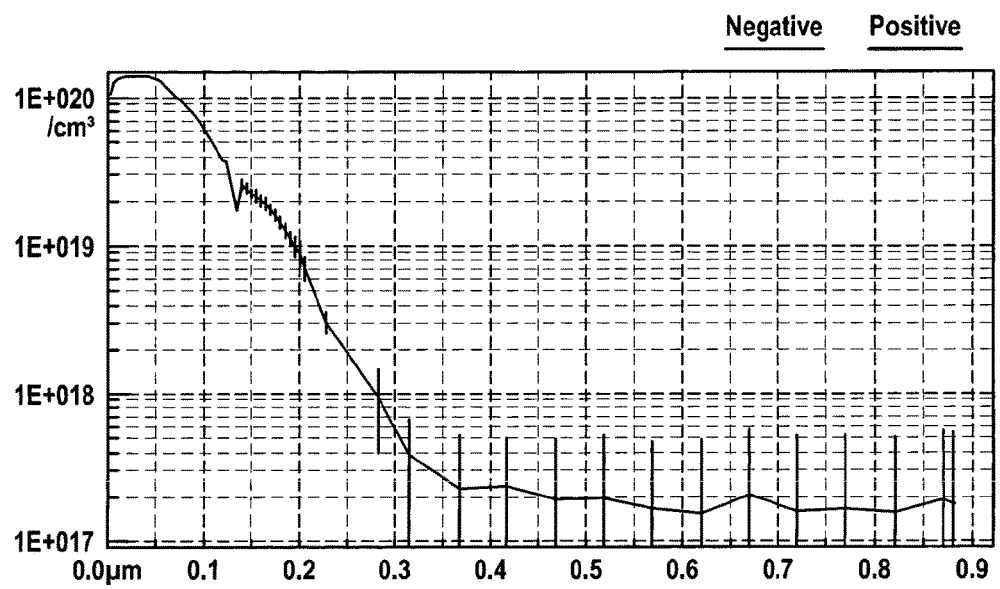
FIG. 9: Doping profile (ECV profile) of a monocrystalline wafer polished on one side after the action of the of the doping paste in accordance with Example 8 in a muffle furnace at 900° C. for 20 minutes (blue=phosphorus doping, red=base doping, boron); photograph of the profile at a distance of ~4 mm outside the region printed with the paste; sheet resistance: 54 Ω/sqr.
Figure 10:
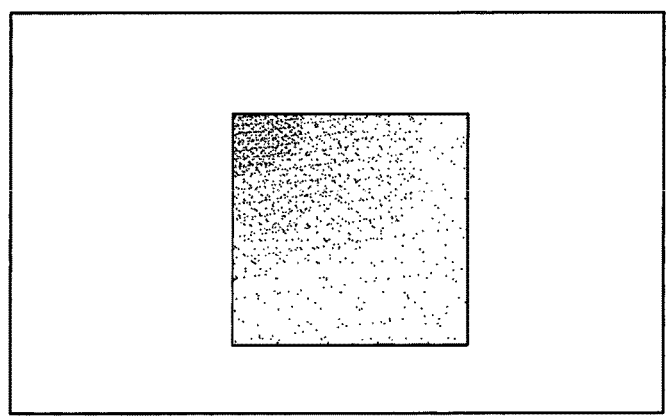
FIG. 10: Photograph of a region of a textured monocrystalline silicon wafer which has been printed with doping paste by means of screen printing. after heating on the hotplate for two minutes.
Figure 11:
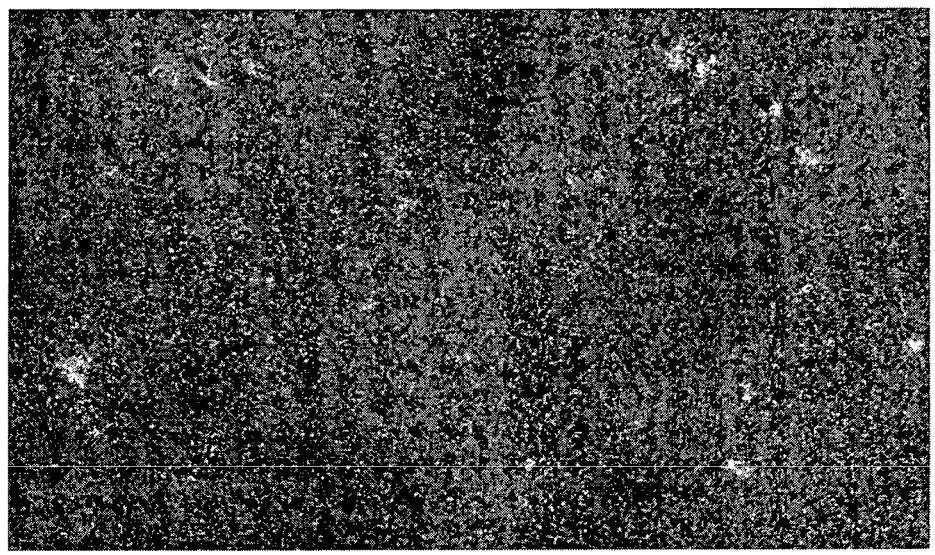
FIG. 11: Photomicrograph of the region of a textured monocrystalline silicon wafer which has been printed with doping paste by means of screen printing, after heating on the hotplate for two minutes.
Figure 12:
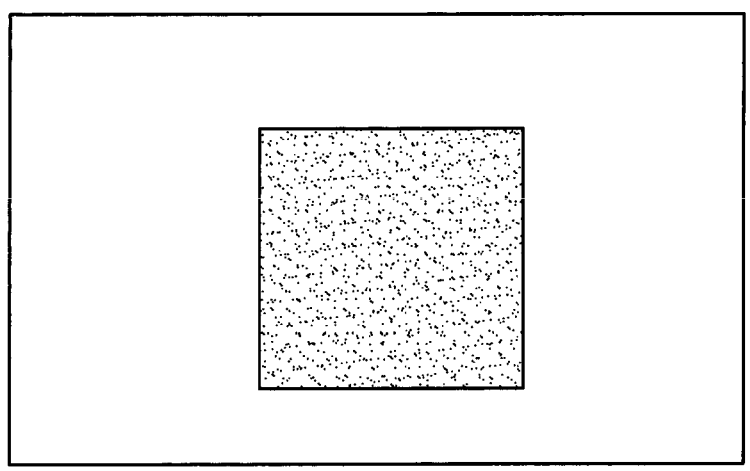
FIG. 12: Photograph of a region of a textured monocrystalline silicon wafer which has been printed with doping paste by means of screen printing, after doping in the muffle furnace.
Figure 13:
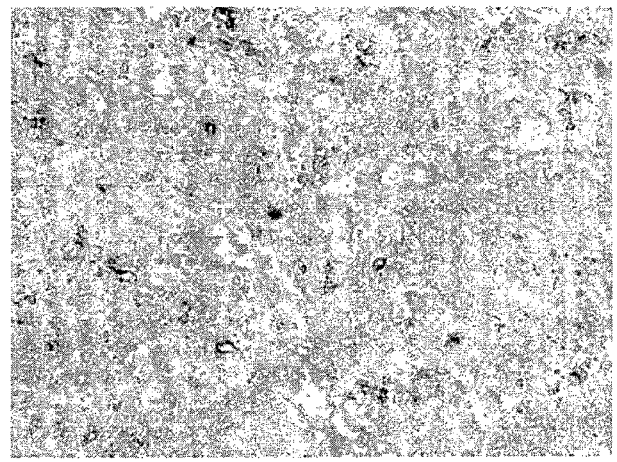
FIG. 13: Photomicrograph of the region of a monocrystalline silicon wafer polished on one side which has been printed with doping paste by means of screen printing, after heating on the hotplate for two minutes.
Figure 14:
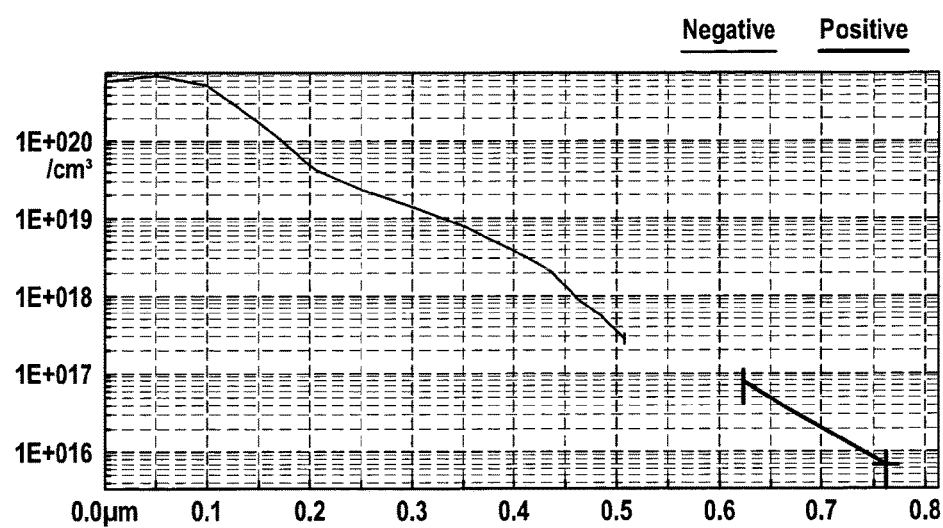
FIG. 14: Doping profile (ECV measurement) of a silicon wafer polished on one side, printed with the doping paste according to the invention (sheet resistance on average 26 Ω/sqr).
Figure 15:
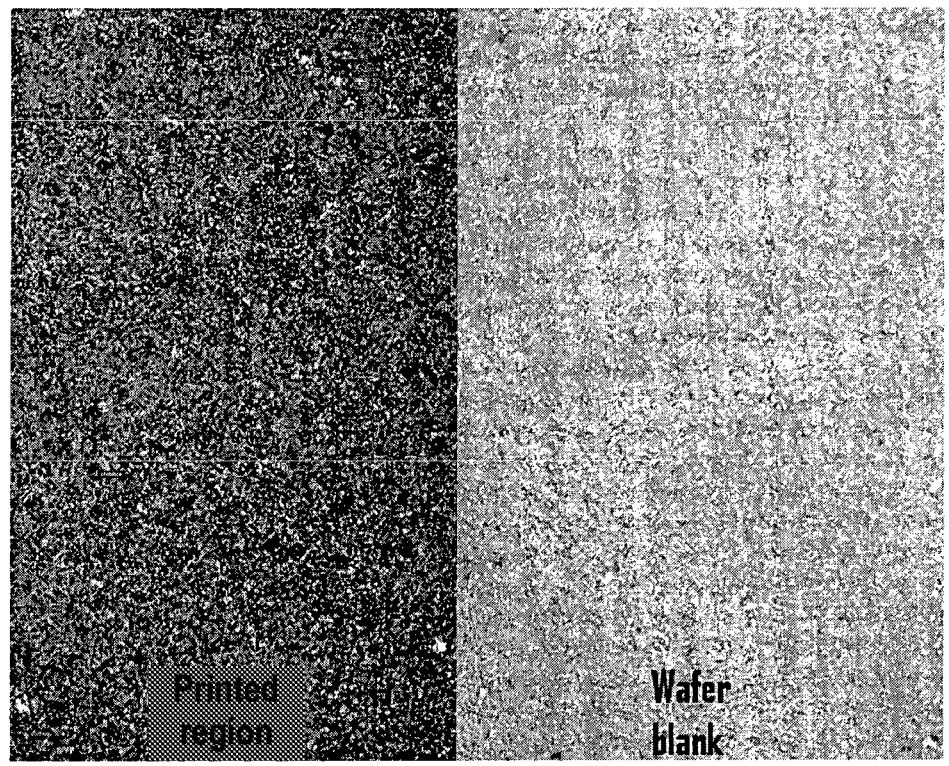
FIG. 15: Photograph of a region of a textured monocrystalline silicon wafer which has been printed with doping paste in accordance with Example 17 using screen printing, after drying on the hotplate.

The invention claimed is:

1. Process for the preparation of printable, high-viscosity oxide media, having a viscosity >500 mPas, in the form of doping media, comprising carrying out an anhydrous sol-gel-based synthesis by condensation of alkoxysilanes and/or alkoxyalkylsilanes with
  a) one or more symmetrical or asymmetrical carboxylic anhydrides
    i. in the presence of boron-containing compounds and/or
    ii. in the presence of phosphorus-containing compounds or
  b) one or more strong carboxylic acids
    i. in the presence of boron-containing compounds and/or
    ii. in the presence of phosphorus-containing compounds or
  c) with a combination of variants a) and b)
    i. in the presence of boron-containing compounds and/or
    ii. in the presence of phosphorus-containing compounds,
  to provide an oxide medium,
    and preparing a paste-form, high-viscosity doping media by controlled gelling of the oxide medium, which comprises: gelling the oxide medium to give a high-viscosity, approximately glass-like material; and either redissolving the resultant product by addition of a solvent or retransforming the resultant product to a sol state by high-shear mixing; and allowing the dissolved or sol state resultant product to retransform to a gel by partial or complete structure recovery.

2. Process according to claim 1, where the alkoxysilanes and/or alkoxyalkylsilanes used contain individual or different saturated or unsaturated, branched or unbranched, aliphatic, alicyclic or aromatic radicals, which may in turn be functionalised at any desired position of the alkoxide radical by heteroatoms selected from the group O, N, S, Cl, Br.

3. Process according to claim 1, where the condensation of the alkoxysilanes and/or alkoxyalkylsilanes in a), b) or c) is in the presence of boron-containing compounds which are selected from boron oxide, boric acid and boric acid esters.

4. Process according to claim 1, where the condensation of the alkoxysilanes and/or alkoxyalkylsilanes in a), b) or c) is in the presence of phosphorus-containing compounds which are selected from phosphorus(V) oxide, phosphoric acid, polyphosphoric acid, phosphoric acid esters and phosphonic acid esters containing siloxane-functionalised groups in the alpha- and beta-position.

5. Process according to claim 1, wherein the condensation of the alkoxysilanes and/or alkoxyalkylsilanes in a), b) or c) is with the strong carboxylic acids, which are selected from formic acid, acetic acid, oxalic acid, trifluoroacetic acid, mono-, di- and trichloroacetic acid, glyoxalic acid, tartaric acid, maleic acid, malonic acid, pyruvic acid, malic acid and 2-oxoglutaric acid.

6. Process according to claim 1, wherein the printable oxide media are prepared in the form of doping media based on hybrid sols and/or gels, using alcoholates/esters, hydroxides or oxides of aluminium, gallium, germanium, zinc, tin, titanium, zirconium, arsenic or lead, or mixtures thereof.

7. Oxide media prepared by a process according to claim 1, which comprise binary or ternary systems selected from $SiO_2$—$P_2O_5$, $SiO_2$—$B_2O_3$, $SiO_2$—$P_2O_5$—$B_2O_3$ and/or mixtures of higher order which arise through the use of alcoholates/esters, hydroxides or oxides of aluminium, gallium, germanium, zinc, tin, titanium, zirconium, arsenic or lead during preparation.

8. Process according to claim 1, wherein, after the oxide medium is gelled to give a high-viscosity, approximately glass-like material, the resultant product is redissolved by addition of a solvent and retransformed to a homogeneous gel by partial or complete structure recovery.

9. Process according to claim 1, wherein the stability of the oxide media is improved by addition of capping agents selected from acetoxytrialkylsilanes, alkoxytrialkylsilanes, halotrialkylsilanes and derivatives thereof.

10. A method for the treatment of silicon wafers for photovoltaic, microelectronic, micromechanical and micro-optical applications, comprising contacting the silicon wafers with a doping medium comprising an oxide medium prepared by the process according to claim 1.

11. A PERC, PERL, PERT or IBC solar cell, where the solar cells have one or more of the following further architecture features: MWT, EWT, selective emitter, selective front surface field, selective back surface field or bifaciality, and wherein the solar cell comprises an oxide medium prepared by the process according to claim 1.

12. A method for the production of a handling- and abrasion-resistant layer on silicon wafers, comprising printing on the surface of the silicon wafers one or more layers of an oxide medium prepared by the process according to claim 1, drying and compacting the layer(s) so they are vitrified on the surface at a temperature range between 50° C. and 750° C., using one or more heating steps to be carried out sequentially by means of a step function and/or a heating ramp, resulting in a handling- and abrasion-resistant layer having a thickness of up to 500 nm.

13. The method of claim 12, wherein the layer(s) vitrified on the surface release silicon-doping atoms, boron and/or phosphorus, to the substrate by heat treatment at a temperature in the range between 750° C. and 1100° C., thereby influencing the conductivity of the substrate.

14. The method of claim 13, wherein the temperature treatment of the layers formed from the printed-on oxide media causes simultaneous co-diffusion with formation of n- and p-type layers.

15. The method of claim 12, wherein the concentration of the doping on the treated substrates differs from the doping of intentionally doped regions by at least two powers of ten.

16. The method of claim 12, wherein
a. silicon wafers are printed with the oxide media as doping media, the printed-on doping media are dried, compacted and subsequently subjected to gas-phase diffusion with phosphoryl chloride, giving high doping levels in the printed regions and lower doping levels in the regions subjected exclusively to gas-phase diffusion, or
b. the oxide medium is deposited over the entire surface of the silicon wafer as doping medium and dried and/or compacted, and the local doping of the underlying substrate material is initiated from the compacted paste with the aid of laser irradiation, or
c. the silicon wafer is printed either over the entire surface or locally with oxide media as doping media, which can be n- and p-doping media, optionally by alternating structures, the printed structures are dried and compacted and encapsulated with diffusion-barrier materials.

17. The method of claim 12, wherein, after the printing of the oxide media according to the invention, drying and compaction thereof and/or doping by temperature treatment, the layers formed are etched with an acid mixture comprising hydrofluoric acid and optionally phosphoric acid, and hydrophobic silicon wafer surfaces are obtained, where the etch mixture used comprises, as etchant, hydrofluoric acid in a concentration of 0.001 to 10% by weight or 0.001 to 10% by weight of hydrofluoric acid and 0.001 to 10% by weight of phosphoric acid in a mixture.

18. The method of claim 17 wherein the oxide media have been prepared with simultaneous use of boron-containing and phosphorus-containing compounds.

19. Process according to claim 1, wherein, after the oxide medium is gelled to give a high-viscosity, approximately glass-like material, the resultant product is retransformed into a sol state by high-shear mixing and then retransformed to a homogeneous gel by partial or complete structure recovery.

* * * * *